(12) United States Patent  (10) Patent No.: US 8,946,051 B2
Yamazaki et al.  (45) Date of Patent: Feb. 3, 2015

(54) METHOD FOR MANUFACTURING SOI SUBSTRATE AND METHOD FOR MANUFACTURING SEMICONDUCTOR DEVICE

(75) Inventors: Shunpei Yamazaki, Tokyo (JP); Eriko Nishida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 551 days.

(21) Appl. No.: 12/410,669

(22) Filed: Mar. 25, 2009

(65) Prior Publication Data
US 2009/0246937 A1 Oct. 1, 2009

(30) Foreign Application Priority Data

Mar. 26, 2008 (JP) ................................. 2008-079557

(51) Int. Cl.
*H01L 21/30* (2006.01)
*H01L 21/46* (2006.01)
*H01L 21/762* (2006.01)
(Continued)

(52) U.S. Cl.
CPC .... *H01L 21/76254* (2013.01); *H01L 21/02057* (2013.01); *H01L 21/02131* (2013.01); *H01L 21/02238* (2013.01); *H01L 21/02255* (2013.01); *H01L 21/31662* (2013.01)
USPC ................... 438/458; 438/459; 257/E21.568; 257/E21.545

(58) Field of Classification Search
None
See application file for complete search history.

(56) References Cited

U.S. PATENT DOCUMENTS 5,374,564 A 12/1994 Bruel
5,949,115 A * 9/1999 Yamazaki et al. ............ 257/396
(Continued)

FOREIGN PATENT DOCUMENTS

EP 0843344 A 5/1998
EP 0961312 A 12/1999
(Continued)

OTHER PUBLICATIONS

Lu et al. "Plasma Immersion Ion Implantation for SOI Synthesis: SIMOX and Ion-Cut", 1998, Journal of Electronic Materials, vol. 27, No. 9, pp. 1059-1066.*

(Continued)

*Primary Examiner* — Leonard Chang
(74) *Attorney, Agent, or Firm* — Eric J. Robinson; Robinson Intellectual Property Law Office, P.C.

(57) ABSTRACT

It is an object to provide a method for manufacturing an SOI substrate in which crystal defects of a single crystal semiconductor layer are reduced even when a single crystal semiconductor substrate in which crystal defects exist is used. Such an SOI substrate can be manufactured through the steps of forming a single crystal semiconductor layer which has an extremely small number of defects over a single crystal semiconductor substrate by an epitaxial growth method; forming an oxide film on the single crystal semiconductor substrate by thermal oxidation treatment; introducing ions into the single crystal semiconductor substrate through the oxide film; bonding the single crystal semiconductor substrate into which the ions are introduced and a semiconductor substrate to each other; causing separation by heat treatment; and performing planarization treatment on the single crystal semiconductor layer provided over the semiconductor substrate.

20 Claims, 18 Drawing Sheets

(51) Int. Cl.
*H01L 21/02* (2006.01)
*H01L 21/316* (2006.01)

(56) References Cited

U.S. PATENT DOCUMENTS

| | | | |
|---|---|---|---|
| 5,966,620 A | 10/1999 | Sakaguchi et al. | |
| 6,271,101 B1 | 8/2001 | Fukunaga | |
| 6,335,231 B1* | 1/2002 | Yamazaki et al. | 438/151 |
| 6,372,609 B1 | 4/2002 | Aga et al. | |
| 6,380,046 B1 | 4/2002 | Yamazaki | |
| 6,534,380 B1 | 3/2003 | Yamauchi et al. | |
| 6,548,035 B1 | 4/2003 | Kimura et al. | |
| 6,548,886 B1 | 4/2003 | Ikari et al. | |
| 6,602,761 B2 | 8/2003 | Fukunaga | |
| 6,613,678 B1 | 9/2003 | Sakaguchi et al. | |
| 6,803,264 B2 | 10/2004 | Yamazaki et al. | |
| 6,875,633 B2 | 4/2005 | Fukunaga | |
| 7,008,860 B2 | 3/2006 | Kakizaki et al. | |
| RE39,484 E | 2/2007 | Bruel | |
| 7,199,024 B2 | 4/2007 | Yamazaki | |
| 7,232,488 B2 | 6/2007 | Akatsu et al. | |
| 7,473,592 B2 | 1/2009 | Yamazaki et al. | |
| 7,476,576 B2 | 1/2009 | Yamazaki et al. | |
| 7,755,113 B2 | 7/2010 | Yamazaki et al. | |
| 2001/0046746 A1* | 11/2001 | Yokokawa et al. | 438/311 |
| 2002/0022348 A1* | 2/2002 | Sakaguchi et al. | 438/480 |
| 2002/0109144 A1 | 8/2002 | Yamazaki | |
| 2003/0003692 A1* | 1/2003 | Suzuki et al. | 438/473 |
| 2003/0170990 A1 | 9/2003 | Sakaguchi et al. | |
| 2003/0232466 A1 | 12/2003 | Zistl et al. | |
| 2004/0038504 A1 | 2/2004 | Ito | |
| 2004/0115905 A1* | 6/2004 | Barge et al. | 438/473 |
| 2004/0185638 A1 | 9/2004 | Kakizaki et al. | |
| 2004/0192067 A1* | 9/2004 | Ghyselen et al. | 438/763 |
| 2005/0064632 A1 | 3/2005 | Sakurada et al. | |
| 2005/0066886 A1 | 3/2005 | Akatsu et al. | |
| 2006/0014330 A1 | 1/2006 | Ichikawa et al. | |
| 2007/0087458 A1 | 4/2007 | Tanaka et al. | |
| 2007/0173000 A1 | 7/2007 | Yamazaki | |
| 2007/0281172 A1 | 12/2007 | Couillard et al. | |
| 2007/0281399 A1* | 12/2007 | Cites et al. | 438/149 |
| 2007/0281440 A1 | 12/2007 | Cites et al. | |
| 2007/0287269 A1* | 12/2007 | Yokokawa et al. | 438/478 |
| 2008/0044669 A1* | 2/2008 | Adachi | 428/446 |
| 2008/0061301 A1 | 3/2008 | Yamazaki | |
| 2008/0067529 A1 | 3/2008 | Yamazaki | |
| 2008/0067597 A1 | 3/2008 | Yamazaki | |
| 2008/0083953 A1 | 4/2008 | Yamazaki | |
| 2008/0213953 A1 | 9/2008 | Yamazaki | |
| 2008/0246109 A1 | 10/2008 | Ohnuma et al. | |
| 2008/0261376 A1 | 10/2008 | Yamazaki et al. | |
| 2008/0261379 A1 | 10/2008 | Jinbo et al. | |
| 2008/0268263 A1 | 10/2008 | Yamazaki | |
| 2008/0286941 A1 | 11/2008 | Yamazaki | |
| 2008/0286942 A1 | 11/2008 | Yamazaki | |
| 2008/0286952 A1 | 11/2008 | Miyairi et al. | |
| 2008/0286956 A1 | 11/2008 | Yamazaki | |
| 2008/0311709 A1 | 12/2008 | Ohnuma | |
| 2009/0117708 A1* | 5/2009 | Nishihata et al. | 438/459 |
| 2009/0246934 A1 | 10/2009 | Yamazaki et al. | |
| 2009/0261449 A1* | 10/2009 | Yamazaki et al. | 257/507 |

FOREIGN PATENT DOCUMENTS

| | | |
|---|---|---|
| EP | 1143045 A | 10/2001 |
| EP | 1519409 A | 3/2005 |
| EP | 1811548 A | 7/2007 |
| JP | 02-054532 | 2/1990 |
| JP | 05-211128 | 8/1993 |
| JP | 09-260619 | 10/1997 |
| JP | 10-200080 A | 7/1998 |
| JP | 11-189493 A | 7/1999 |
| JP | 2000-012864 | 1/2000 |
| JP | 2000-030993 | 1/2000 |
| JP | 2000-036583 A | 2/2000 |
| JP | 2000-077287 A | 3/2000 |
| JP | 2000-109396 A | 4/2000 |
| JP | 2000-294754 | 10/2000 |
| JP | 2005-252244 | 9/2005 |
| WO | WO-01/27362 | 4/2001 |
| WO | WO-03/103057 | 12/2003 |
| WO | WO-2007/142852 | 12/2007 |

OTHER PUBLICATIONS

U.S. Appl. No. 12/410,649 claims as filed (published as US20090261449).*

Zehner.D et al., "Preparation of atomically clean silicon surfaces by pulsed laser irradiation,", Appl. Phys. Lett.(Applied Physics Letters), 1980, vol. 36, No. 1, pp. 56-59.

European Search Report (Application No. 09003878.7) Dated Dec. 21, 2010.

* cited by examiner

| Accelerating Voltage | Hydrogen atom (H) ratio (X:Y) | Hydrogen ion ratio (X:Y/3) |
|---|---|---|
| 80kV | 1:44.1 | 1:14.7 |
| 60kV | 1:42.5 | 1:14.2 |
| 40kV | 1:43.5 | 1:14.5 |

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to a method for manufacturing an SOI substrate having a semiconductor layer formed over an insulating film and a method for manufacturing a semiconductor device.

2. Description of the Related Art

In recent years, instead of a bulk silicon wafer, integrated circuits using an SOI (silicon on insulator) substrate have been developed. By utilization of characteristics of a thin silicon wafer formed over an insulating film, semiconductor layers of transistors in the integrated circuit can be electrically separated from each other completely, and further the transistor can be a fully depleted transistor. Thus, a semiconductor integrated circuit with high added value such as high integration, high speed driving, and low power consumption can be realized.

A SIMOX substrate and a bonded substrate are known as an SOI substrate. For example, an SOI structure of a SIMOX substrate is obtained in such a manner that oxygen ions are implanted into a silicon wafer and heat treatment at greater than or equal to 1300° C. is performed to form a buried oxide film (BOX), whereby a silicon wafer is formed on a surface of the substrate.

An SOI structure of a bonded substrate is obtained in such a manner that two silicon wafers (a base substrate and a bond substrate) are bonded to each other with an oxide film interposed therebetween and one of the silicon wafers (the bond substrate) is thinned from its rear surface (a surface which is not used for bonding), so that a silicon wafer is formed. Since it is difficult to form a uniform silicon wafer by grinding or polishing, a technique employing hydrogen ion implantation which is called Smart-Cut (registered trademark) has been proposed (e.g., Patent Document 1: Japanese Published Patent Application No. H5-211128).

The summary of this method for manufacturing an SOI substrate will be described below. By implantation of hydrogen ions into a silicon wafer by an ion implantation method, an embrittled region is formed at a predetermined depth from a surface of the silicon wafer. Next, another silicon wafer which serves as a base substrate is oxidized to form a silicon oxide film. After that, the silicon wafer into which hydrogen ions are implanted and the silicon oxide film on the silicon wafer which serves as a base substrate are bonded to each other to bond the two single crystal silicon substrates. Then, through heat treatment, the silicon wafer is separated (cleaved) at an ion implanted layer, so that a substrate in which a thin single crystal silicon layer is bonded to the silicon wafer which serves as a base substrate is formed.

An ion implantation method is a method in which particles which are desired to be implanted into a sample are ionized in vacuum and accelerated by an electric field to be implanted into the sample. An ion implantation apparatus which is used for an ion implantation method includes an ion source, a mass separation unit, an acceleration unit, a beam operation (electrostatic scan) unit, an implantation chamber (an end station), and an evacuation unit. Further, since a cross section of an ion beam is not uniform, electrical scanning with an ion beam is performed in order to obtain uniformity on a surface of the sample.

Further, as an example of a semiconductor device using an SOI substrate, a method for manufacturing a semiconductor device using a substrate with high heat resistance as a supporting substrate, with the use of Smart-Cut (registered mark) is disclosed (see Patent Document 2: Japanese Published Patent Application No. 2000-012864). Patent Document 2 also discloses implantation of hydrogen by an ion implantation method

SUMMARY OF THE INVENTION

In general, in order to manufacture an SOI substrate as described above, a silicon wafer manufactured by Czochralski (CZ) method is used. In this silicon wafer manufactured by a CZ method, crystal defects which are caused at the time of crystal growth exist. Such crystal defects cause various crystal defects at the time of processing a wafer, at the time of manufacturing an SOI substrate, and in a process of manufacturing a semiconductor device.

Thus, if an SOI substrate is manufactured using such a silicon wafer having crystal defects, it is difficult to obtain an SOI substrate with high crystallinity. Further, if crystal defects exist in an SOI substrate, the crystal defects have a significant effect on characteristics of a semiconductor device.

Further, although a silicon wafer from which a single crystal silicon layer is separated can be reused, crystal defects or damage due to separation remains in or on the surface of the silicon wafer and crystallinity is damaged, and thus it is difficult to obtain an SOI substrate with high crystallinity.

It is an object of one embodiment of the present invention to provide a method for manufacturing an SOI substrate in which crystal defects of a single crystal semiconductor layer are reduced even when a single crystal semiconductor substrate in which crystal defects exist is used. It is another object to provide a method for manufacturing a semiconductor device which has excellent electrical characteristics by using such an SOI substrate.

One embodiment of the present invention is a method for manufacturing an SOI substrate including the steps of forming a single crystal semiconductor layer which has an extremely small number of defects over a single crystal semiconductor substrate by an epitaxial growth method; forming an oxide film on the single crystal semiconductor substrate by thermal oxidation treatment; introducing ions into the single crystal semiconductor substrate through the oxide film; bonding the single crystal semiconductor substrate into which the ions are introduced and a semiconductor substrate to each other; causing separation by heat treatment; and performing planarization treatment on the single crystal semiconductor layer provided over the semiconductor substrate. A specific structure according to one embodiment of the present invention will be described below.

One embodiment of the present invention is a method for manufacturing an SOI substrate including the steps of forming a single crystal semiconductor layer over a single crystal semiconductor substrate by an epitaxial growth method; performing thermal oxidation treatment on the single crystal semiconductor substrate over which the single crystal semiconductor layer is formed to form an oxide film on a surface of the single crystal semiconductor substrate; irradiating the single crystal semiconductor layer with ions through the oxide film from a side on which the single crystal semiconductor layer is formed to form an embrittled region in a region at a predetermined depth from a surface of the single crystal semiconductor layer; performing bonding so that a surface on which the single crystal semiconductor layer is formed and one of surfaces of a semiconductor substrate face each other with the oxide film interposed therebetween; causing separation at the embrittled region by heat treatment to obtain the single crystal semiconductor substrate and the semiconductor substrate to which the separated single crystal semiconductor layer is bonded; and performing planarization treatment on the single crystal semiconductor layer which is bonded to the semiconductor substrate.

In this specification, the term "single crystal" refers to a crystal in which crystal planes or crystal axes are aligned and atoms or molecules which are included in the single crystal are aligned in a spatially ordered manner. However, although a single crystal is structured by orderly aligned atoms, a single crystal may include a lattice defect in which part of the alignment is disordered or a single crystal may include intended or unintended lattice distortion.

Note that a semiconductor device in this specification refers to general devices which can function by utilizing semiconductor characteristics, and electro-optical devices, semiconductor circuits, and electronic appliances are all semiconductor devices.

Further, a display device in this specification includes a liquid crystal display device or a light-emitting device in its category. The liquid crystal display device includes a liquid crystal element, and the light-emitting device includes a light-emitting element. The light-emitting element includes an element whose luminance is controlled by current or voltage in its category. Specifically, the light-emitting element includes an inorganic EL (electroluminescence) element, an organic EL element, and the like in its category.

According to one embodiment of the present invention, an SOI substrate of which crystal defects generated in a single crystal semiconductor layer are reduced can be manufactured. According to another embodiment of the present invention, a semiconductor device with excellent electric characteristics can be manufactured using such an SOI substrate.

DETAILED DESCRIPTION OF THE INVENTION

Figure 1A:
FIGS. 1A to 1F are views illustrating an example of a method for manufacturing an SOI substrate.

Embodiments of the present invention will be hereinafter described with reference to the accompanying drawings. Note that it is easily understood by those skilled in the art that the present invention can be implemented in many different modes and modes and details can be modified in a variety of ways without departing from the purpose and scope of the present invention. Therefore, the present invention should not be interpreted as being limited to the description below of Embodiments. Note that reference numerals indicating the same portions are used in common in all drawings describing Embodiments, and repeated description thereof is omitted.

Embodiment 1

In this embodiment, an example of a method for manufacturing an SOI substrate will be described with reference to drawings. Specifically, a method for manufacturing an SOI substrate using a single crystal semiconductor layer which has an extremely small number of defects over a single crystal semiconductor substrate by an epitaxial growth method will be described.

First, a single crystal semiconductor substrate 101 is prepared and washed using a sulfuric acid/hydrogen peroxide mixture (SPM), an ammonium hydroxide/hydrogen peroxide mixture (APM), a hydrochloric acid/hydrogen peroxide mixture (HPM), dilute hydrogen fluoride (DHF), or the like as appropriate. As the single crystal semiconductor substrate 101, a commercial single crystal semiconductor substrate can be used. For example, a single crystal silicon substrate, a single crystal germanium substrate, and a single crystal compound semiconductor substrate using gallium arsenide, indium phosphide, or the like can be used. A size of a commercial silicon substrate is typically 5 inches (125 mm) in diameter, 6 inches (150 mm) in diameter, 8 inches (200 mm) in diameter, 12 inches (300 mm) in diameter, or 18 inches (450 mm) in diameter, and a typical shape thereof is a circular shape. Note that the shape is not limited to a circular shape, and a silicon substrate processed into a rectangular shape or the like can also be used. Hereinafter, the case in which a single crystal silicon substrate is used as the single crystal semiconductor substrate 101 will be described.

Next, a single crystal semiconductor layer 102 is formed over the single crystal semiconductor substrate 101 by an epitaxial growth method (see FIG. 1A).

The epitaxial growth method is a technique in which over a single crystal semiconductor substrate, a single crystal semiconductor layer having a crystal axis identical to a crystal axis of the single crystal semiconductor substrate is grown. In particular, a case where the single crystal semiconductor substrate and a layer formed by an epitaxial growth method are formed using the same element, as described in this embodiment, is referred to as homoepitaxy. Further, since a crystal having the same lattice constant as the single crystal semiconductor substrate is grown over the single crystal semiconductor substrate in homoepitaxy, a high-quality layer having the smallest number of crystal defects can be obtained.

An epitaxial growth method is classified into a vapor phase epitaxial method, a liquid phase epitaxial method, and a solid phase epitaxial method depending on the growth method, and any of the above methods can be used. For example, vapor phase epitaxy includes physical vapor deposition such as molecular beam epitaxy (MBE), and chemical vapor deposition. In this embodiment, an example will be described in which a single crystal semiconductor layer 102 is formed by a chemical vapor deposition method which is one of the vapor phase epitaxial methods. Chemical vapor deposition method is a method in which a vapor source material is brought to a region in which a crystal is to be grown, and the crystal is grown there. That is, the vapor source material is brought by a carrier gas, over the single crystal semiconductor substrate 101, so that the single crystal semiconductor layer 102 is formed over the single crystal semiconductor substrate 101.

In this embodiment, for example, in the case of forming a single crystal silicon layer by a chemical vapor deposition method, a silane gas is used as a source material and the epitaxial growth is preferably performed under a temperature condition of higher than or equal to 1000° C. Further, with the use of a single crystal silicon substrate to which nitrogen is added, a single crystal silicon layer having the smaller number of defects can be formed.

The thickness of the single crystal semiconductor layer 102 is at least greater than or equal to 50 nm, and preferably greater than or equal to 200 nm. This is because when the thickness of the single crystal semiconductor layer 102 is smaller than 50 nm, the single crystal semiconductor layer 102 is substantially lost in a subsequent thermal oxidation step or a subsequent separation step.

Note that when a native oxide film (e.g. a silicon oxide film) or the like is formed over the single crystal semiconductor substrate 101 or when impurities exist on the single crystal semiconductor substrate 101, there is concern that the high-quality single crystal semiconductor layer 102 cannot be formed. Accordingly, before formation of the single crystal semiconductor layer 102, such a native oxide film or impurities are preferably removed in advance.

As described above, the single crystal semiconductor layer 102 is formed over the single crystal semiconductor substrate 101 by an epitaxial growth method, whereby the single crystal semiconductor layer 102 having the small number of defects can be formed, and increase in the number of defects can be suppressed in a subsequent step.

When the surface of the single crystal semiconductor layer 102 formed by an epitaxial growth method is uneven, planarization treatment (e.g. chemical mechanical polishing treatment (abbreviation: CMP)) is preferably performed on the surface of the single crystal semiconductor layer 102. By improving the planarity of the single crystal semiconductor layer 102, an oxide film 103 can be formed later to have planarity. When the single crystal semiconductor layer 102 has desired planarity, planarization treatment may be omitted. Note that chemical mechanical polishing is treatment for planarizing a surface by chemical and mechanical polishing using slurry in which an alkaline solution and polishing abrasive grains are mixed.

Figure 1B:
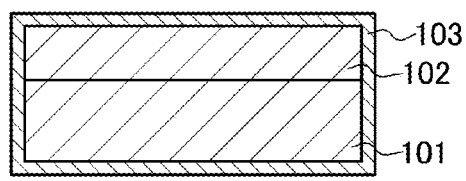

Next, thermal oxidation treatment is performed on the single crystal semiconductor substrate 101 over which the single crystal semiconductor layer 102 is formed, whereby the oxide film 103 is formed on a surface of the single crystal semiconductor substrate 101 (see FIG. 1B). As thermal oxidation treatment, oxidation in an oxidizing atmosphere to which halogen is added is preferably performed. As a gas for adding halogen to an oxidizing atmosphere, one or more kinds of gases selected from HCl, HF, $NF_3$, HBr, $Cl_2$, DCE (Dichloroethylene), $ClF_3$, $BCl_3$, $F_2$, $Br_2$, and the like can be used.

In this embodiment, it is preferable to perform thermal oxidation treatment in an atmosphere containing hydrogen chloride (HCl) at 0.5 to 10 vol % (preferably 3 vol %) with respect to oxygen, at temperatures of 900° C. to 1150° C. (typically, 1000° C.). Treatment time may be 0.1 hours to 6 hours, and preferably, 0.5 hours to 1 hour. The thickness of the oxide film 103 which is formed is 10 nm to 1000 nm (preferably, 50 nm to 300 nm), for example, 200 nm. Further, in the case of using trans-1,2-dichloroethylene, because the temperature at which trans-1,2-dichloroethylene is thermally decomposed is low, trans-1,2-dichloroethylene is effective when the thermal oxidation treatment is desired to be performed at a low temperature. Note that, instead of trans-1,2-dichloroethylene, cis-1,2-dichloroethylene, 1,1-dichloroethylene, or a mixed gas of two kinds or more of the above-described gases may be used.

By performing thermal oxidation treatment at such a temperature range, impurities such as a metal contained in the single crystal semiconductor substrate 101 and the single crystal semiconductor layer 102 can be removed. That is, even when impurities such as a metal are contained in the single crystal semiconductor substrate 101 and the single crystal semiconductor layer 102, by the action of halogen, the impurities such as a metal turn into volatile chloride, and then are released into an air phase, thereby being removed from the single crystal semiconductor substrate 101 and the single crystal semiconductor layer 102. It has an advantageous effect on the case where the surface of the single crystal semiconductor substrate 101 is subjected to chemical mechanical polishing treatment.

Halogen is contained in the oxide film 103 formed by thermal oxidation treatment performed in an oxidizing atmosphere to which halogen is added. A halogen is contained at concentrations ranging from $1 \times 10^{16}/cm^3$ to $5 \times 10^{21}/cm^3$, whereby the oxide film can function as a blocking layer which captures impurities such as a metal and prevents contamination of the single crystal semiconductor substrate 101. Also, by the halogen used in the thermal oxidation treatment, a dangling bond on a surface of the single crystal semiconductor substrate 101 is terminated, and thus localized level density at an interface of the oxide film 103 and the single crystal semiconductor substrate 101 can be reduced.

In this embodiment, as a method for forming the oxide film 103 containing a chlorine atom, the case where thermal oxidation treatment is performed in an oxidizing atmosphere containing hydrogen chloride or dichloroethylene is described; however, the method is not limited thereto. For example, by performing thermal oxidation treatment on the single crystal semiconductor substrate 101 in an oxidizing atmosphere, the oxide film 103 (e.g. SiOx) is formed on the surface of the single crystal semiconductor substrate 101 (see FIG. 1B), and then chlorine atoms may be contained in the oxide film 103 by addition of chlorine ions accelerated by an electric field with the use of an ion doping apparatus or an ion implantation apparatus. Alternatively, the surface of the single crystal semiconductor substrate 101 is processed with hydrogen chloride (HCl) solution, and then thermal oxidation treatment may be performed in an oxidizing atmosphere.

Figure 1C:
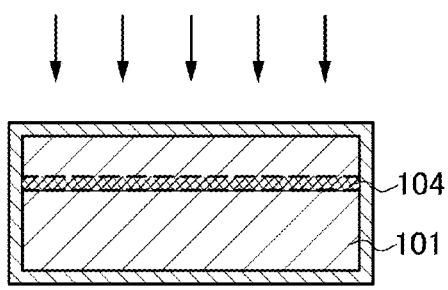

Next, ion irradiation is performed on the single crystal semiconductor layer 102 from a side where the single crystal semiconductor layer 102 is formed through the oxide film 103, whereby an embrittled region 104 is formed in a region at a predetermined depth from a surface of the single crystal semiconductor layer 102 (see FIG. 1C).

In order to form the embrittled region 104 by performing ion irradiation on the single crystal semiconductor layer 102, an ion doping apparatus can be used. In an ion doping apparatus, a source gas is excited to generate plasma, ion species are extracted from the plasma, and the ion species which are not mass-separated are introduced into the object to be processed. By the use of the ion doping apparatus, the single crystal semiconductor substrate 101 can be homogeneously doped. Note that in an ion doping apparatus provided with a mass separator, ion implantation with mass separation can be conducted.

In the case of employing an ion doping method, as a source gas which is used for adding ions, a hydrogen gas, a rare gas, and the like are given. In this embodiment, a hydrogen gas is preferably used. When a hydrogen gas is used as a source gas, ion species which are generated are $H^+$, $H_2^+$, and $H_3^+$, and it is preferable that the number of $H_3^+$ which are introduced be the largest. The introduction efficiency of $H_3^+$ ions is better than that of $H^-$ ions and $H_2^+$ ions; thus, reduction in introduction time can be achieved. Moreover, a crack is easily generated in the embrittled region 104 in a later step.

The depth at which the embrittled region 104 is formed can be adjusted by the accelerating energy of the ions and the incidence angle thereof. The acceleration energy can be adjusted by an acceleration voltage, dosage, or the like. The embrittled region 104 is formed at the same depth or substantially the same depth as the average depth at which the ions have entered. The depth to which ions are introduced determines the thickness of the single crystal semiconductor layer separated from the single crystal semiconductor substrate 101 in a later step.

The depth at which the embrittled region 104 is formed is greater than or equal to 10 nm and less than or equal to 500 nm, and preferably greater than or equal to 50 nm and less than or equal to 200 nm from the surface of the single crystal semiconductor layer 102. Further, the embrittled region 104 is preferably formed in the single crystal semiconductor layer 102. This is because when the embrittled region 104 is formed in the single crystal semiconductor substrate 101, due to the crystal defects generated at the time of crystal growth of the single crystal semiconductor substrate 101 or the crystal defects formed at the time of processing a wafer, the number of the crystal defects increases. By formation of the embrittled region 104 in the single crystal semiconductor layer 102 having the small number of crystal defects which is formed by an epitaxial growth method, increase in crystal defects can be suppressed.

When an ion doping method is employed, since the ion doping apparatus performs introduction of ions without mass separation, metal ions are introduced into the single crystal semiconductor layer 102 together with hydrogen ions in some cases. Since a metal ion has the large mass number, most metal ions are distributed on an outermost surface of a side into which the ions are introduced. In this embodiment, the surface of the single crystal semiconductor substrate 101 is provided with the oxide film 103. When the oxide film 103 is formed thicker than the depth at which the metal ions are introduced, the distribution of the metal can be kept within the oxide film 103. That is, when halogen is contained in the oxide film 103, the oxide film 103 has an effect of gettering impurities such as a heavy metal which has an adverse effect on the single crystal semiconductor layer 102. Accordingly, the impurities captured in the oxide film 103 are confined, whereby contamination of the single crystal semiconductor layer 102 can be prevented.

Next, a semiconductor substrate 111 for being bonded to the single crystal semiconductor substrate 101 is prepared. For the semiconductor substrate 111, a similar substrate to the single crystal semiconductor substrate 101 can be used. Alternatively, a polycrystalline semiconductor substrate, a solar-grade silicon substrate (SOG-Si; e.g., a material having a Si purity of 99.9999%) that is used for manufacturing a solar battery, or the like can also be used. The polycrystalline semiconductor substrate described in this specification includes a polycrystalline silicon substrate, a polycrystalline compound semiconductor substrate, further, a polycrystalline silicon substrate including a slight amount of germanium, or a polycrystalline silicon substrate including a slight amount of boron in its category.

Figure 1D:
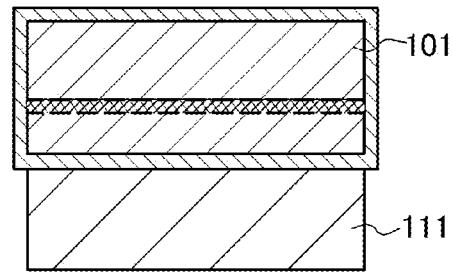

Next, bonding is performed so that the oxide film 103 and one of the surfaces of the semiconductor substrate 111 face each other (see FIG. 1D). By disposing the oxide film 103 in contact with the semiconductor substrate 111, the substrates attract each other by van der Waals forces. Further, Si—OH groups formed at the surface of the substrate bond to one another with hydrogen bonding. A heat treatment at a low temperature (e.g., 150° C. to 200° C.) causes a dehydration condensation reaction to form a bond from which a water molecule is released and in which an oxygen atom is present between silicon atoms (Si—O—Si). By further performing heat treatment at a higher temperature (e.g., 600° C.), oxygen is diffused and Si atoms bond to one another at an interface, so that the single crystal semiconductor substrate 101 and the semiconductor substrate 111 are bonded to each other more firmly. In this embodiment, as an insulating film for bonding the single crystal semiconductor substrate 101 and the semiconductor substrate 111 to each other, the oxide film 103 obtained by thermal oxidation treatment is used. Since the oxide film 103 obtained by thermal oxidation treatment has smoothness, the single crystal semiconductor substrate 101 and the semiconductor substrate 111 can be bonded to each other favorably.

In order to favorably bond the semiconductor substrate 111 and the oxide film 103 to each other, a bonding surface may be activated. For example, one or both of the bonding surfaces are irradiated with an atomic beam or an ion beam. When an atomic beam or an ion beam is used, an inert gas neutral atom beam or inert gas ion beam of argon or the like can be used. It is also possible to activate the bonding surface by plasma irradiation or radical treatment. By such activation treatment, even at temperatures of lower than or equal to 400° C., the single crystal semiconductor substrate and the semiconductor substrate can be easily bonded to each other.

Further, before bonding the single crystal semiconductor substrate 101 and the semiconductor substrate 111 to each other, surface treatment is preferably performed on the oxide film 103 with which the single crystal semiconductor substrate 101 is provided and the semiconductor substrate 111. As surface treatment, ozone treatment (e.g., cleaning with ozone water) or megasonic cleaning and cleaning with ozone water can be performed. Further, cleaning with ozone water and cleaning with hydrofluoric acid may be repeated plural times. Through such surface treatment, dust such as an organic substance on the surfaces of the oxide film 103 and the semiconductor substrate 111 can be removed and the surface of the oxide film 103 can be made hydrophilic.

After bonding the single crystal semiconductor substrate 101 and the semiconductor substrate 111 to each other, one or both of heat treatment and pressure treatment are preferably performed. By heat treatment or pressure treatment, bonding strength between the single crystal semiconductor substrate 101 and the semiconductor substrate 111 can be increased. Heat treatment is performed at temperatures at which elements or molecules added to the embrittled region 104 are not separated out, and the heat temperature is preferably lower than or equal to 350° C. In other words, this heat temperature is a temperature at which gas is not released from the embrittled region 104. The pressure treatment is performed so that pressure is applied perpendicularly to the bonding surface, in consideration of the pressure resistance of the single crystal semiconductor substrate 101 and the semiconductor substrate 111.

Figure 1E:
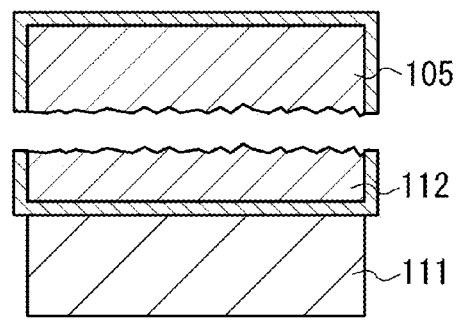

Next, by heat treatment, the single crystal semiconductor layer 102 is separated at the embrittled region 104, and thus a single crystal semiconductor substrate 105 and the semiconductor substrate 111 to which a single crystal semiconductor layer 112 is bonded are obtained (see FIG. 1E). A rapid thermal anneal (RTA) apparatus or a lamp rapid thermal anneal (LRTA) apparatus which performs heating with the use of a halogen lamp or an infrared lamp can be used for heat treatment here. It is preferable that the temperature of the semiconductor substrate 111 to which the single crystal semiconductor layer 112 is bonded be increased to higher than or equal to 550° C. and lower than or equal to 650° C. by this heat treatment.

In this embodiment, heat treatment by using a vertical furnace having resistance heating is performed. The semiconductor substrate 111 to which the single crystal semiconductor substrate 101 is bonded is loaded into a boat for the vertical furnace. The boat is carried in a chamber of the vertical furnace. First, the chamber is exhausted to have a vacuum state in order to suppress oxidation of the single crystal semiconductor substrates 101. The degree of vacuum is approximately 5×10$^{-3}$ Pa. After making the vacuum state, the chamber is supplied with nitrogen so as to be in a nitrogen atmosphere under atmospheric pressure. During this, the temperature is increased to 200° C.

After the chamber is made to have a nitrogen atmosphere under atmospheric pressure, heating is performed at 200° C. for two hours. Then, the temperature is increased to 400° C. in one hour. After the state at a heating temperature of 400° C. stabilizes, the temperature is increased to 600° C. in one hour. After the state at a heating temperature of 600° C. stabilizes, heat treatment is performed at 600° C. for two hours. Then, the temperature is decreased to 400° C. in one hour, and after 10 minutes to 30 minutes, the boat is carried out of the chamber. In an air atmosphere, the single crystal semiconductor substrate 101 and the semiconductor substrate 111 to which the single crystal semiconductor substrate 101 is bonded are cooled on the boat.

In the above-mentioned heat treatment using a resistance heating furnace, heat treatment to increase bonding force between the single crystal semiconductor substrate 101 and the semiconductor substrate 111, and heat treatment to cause separation in the embrittled region 104 are performed in succession. In the case where the two heat treatment is performed with different apparatuses, for example, heat treatment at a treatment temperature of 200° C. is performed for a treatment time of 2 hours in the resistance heating furnace, and the semiconductor substrate 111 and the single crystal semiconductor substrate 101, which are bonded to each other, are carried out from the furnace. Next, heat treatment is performed at a temperature in the range of higher than or equal to 600° C. and lower than or equal to 700° C. for greater than or equal to 1 minute and less than or equal to 30 minutes with an RTA apparatus, so that the single crystal semiconductor substrate 101 is separated at the embrittled region 104.

In this manner, heat treatment is performed to cause separation (cleavage) at the embrittled region 104, whereby the single crystal semiconductor layer 112 can be provided over the semiconductor substrate 111 with the oxide film 103 interposed therebetween (see FIG. 1E). Further, by reusing the single crystal semiconductor substrate 105 obtained after the single crystal semiconductor layer 112 is separated from the single crystal semiconductor substrate 101, manufacturing cost can be reduced. Since the heat treatment process illustrated in FIG. 1E can be performed at a relatively low temperature of lower than or equal to 700° C., damage to the single crystal semiconductor substrate 101 due to heat can be suppressed. Thus, such heat treatment process is effective in reusing the single crystal semiconductor substrate 101.

Figure 1F:
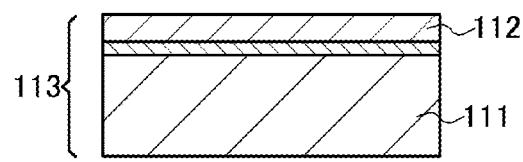

Note that planarization treatment is preferably performed on the single crystal semiconductor layer 112 obtained through the above-described process. As planarization treatment, one or a combination of plural methods of treatment for improving planarity of the single crystal semiconductor layer 112 and treatment for recovering the crystallinity is preferably performed (see FIG. 1F). In the single crystal semiconductor layer 112 which is bonded to the semiconductor substrate 111 and on a surface thereof, a crystal defect is formed due to formation of the embrittled region 104 and separation at the embrittled region 104. By treatment for improving planarity, a crystal defect on the surface of the single crystal semiconductor layer 112 can be reduced. Further, by palanarization treatment, the single crystal semiconductor layer can be thinned. By treatment for recovering the crystallinity, the crystal defect in the single crystal semiconductor layer 112 can be eliminated and the distortion of the single crystal semiconductor layer 112 can be relieved.

As treatment for improving planarity, one or a combination of plural methods of CMP treatment and etching treatment can be performed. As etching treatment, dry etching or wet etching can be used. Examples of etching gases that can be used in dry etching treatment include: chloride gases such as boron chloride, silicon chloride, and carbon tetrachloride; a chlorine gas; fluoride gases such as sulfur fluoride and nitrogen fluoride; an oxygen gas; and the like. In wet etching treatment, as an etchant, for example, a tetramethylammonium hydroxide (abbreviation: TMAH) solution can be used. As treatment for recovering crystallinity, heat treatment is performed at 500° C. to 700° C. The heat treatment at 500° C. to 700° C. can be performed by using an RTA apparatus, a resistance heating furnace, or a microwave heating apparatus. As the RTA apparatus, a GRTA apparatus, or an LRTA apparatus can be used.

In this embodiment, for example, after improving planarity of the surface of the single crystal semiconductor layer 112 by CMP treatment, slurry or the like to be used in the CMP treatment is washed, and then, heat treatment is performed at 500° C. to 700° C. to recover the crystallinity. Alternatively, after heat treatment is performed at 500° C. to 700° C. to recover the crystallinity, CMP treatment can be performed.

Further, in order to thin the single crystal semiconductor layer 112, etching treatment, thermal oxidation treatment, or CMP treatment may be performed. In the case of using etching treatment, for example, in order to thin the single crystal semiconductor layer 112, one or a combination of dry etching treatment and wet etching treatment may be applied. For example, when the single crystal semiconductor layer 112 is a layer formed using a silicon material, it can be thinned by dry etching using $SF_6$ and $O_2$ as a process gas.

The thickness of the single crystal semiconductor layer 112 can be determined in accordance with characteristics of an element to be formed with the single crystal semiconductor layer 112. In order to form a thin gate insulating layer with excellent step coverage over the surface of the single crystal semiconductor layer 112 which is bonded to the semiconductor substrate 111, the thickness of the single crystal semiconductor layer 112 is preferably less than or equal to 50 nm and may be greater than or equal to 5 nm and less than or equal to 50 nm.

Through the above-described steps, an SOI substrate 113 can be manufactured in which the single crystal semiconductor layer 112 is formed over the semiconductor substrate 111 with the oxide film 103 interposed therebetween. That is, the single crystal semiconductor layer is formed by an epitaxial growth method, whereby crystal defects due to the single crystal semiconductor substrate are reduced. This makes it possible to suppress increase in defects in a subsequent step (e.g. a step of introducing ions or a step of heating and separating). Further, by thermal oxidation in an atmosphere to which halogen is added, impurities in the single crystal semiconductor layer can be removed and confined in the oxide film. Furthermore, by planarization treatment, crystal defects generated due to ion introduction can be reduced. As a result, an SOI substrate with excellent crystallinity can be manufactured.

Figure 2:
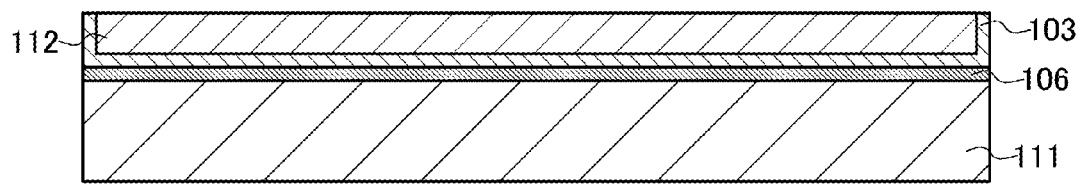
FIG. 2 is a view illustrating an example of a structure of an SOI substrate.
Figure 3:
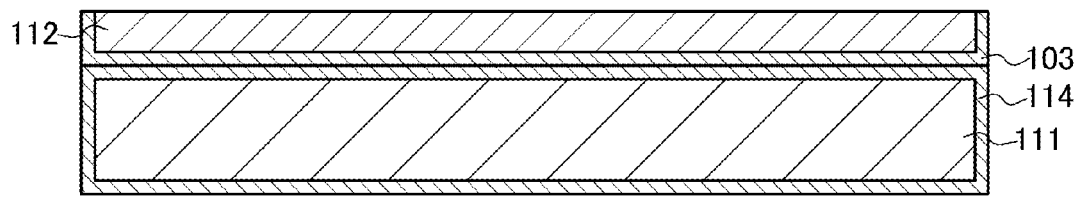
FIG. 3 is a view illustrating an example of a structure of an SOI substrate.
Figure 4:
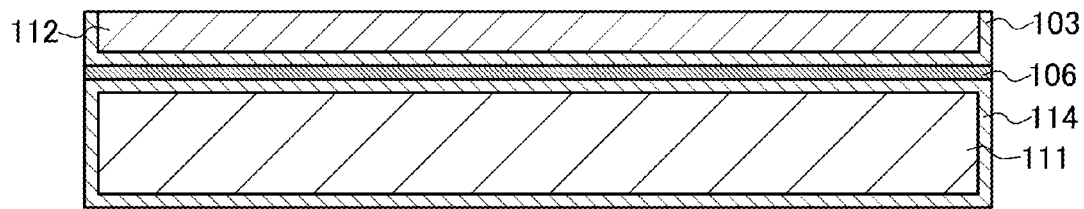
FIG. 4 is a view illustrating an example of a structure of an SOI substrate.

This embodiment is not limited to the structure illustrated in FIGS. 1A to 1F, and may have structures illustrated in FIG. 2, FIG. 3, and FIG. 4, for example. FIG. 2 illustrates a structure in which the single crystal semiconductor layer 112 is provided over the semiconductor substrate 111 with an insulating film 106 and the oxide film 103 interposed therebetween. The insulating film 106 is formed, over the semiconductor substrate 111, using a material having an oxidation property, such as silicon oxide, silicon oxynitride, silicon nitride, or silicon nitride oxide. The insulating film 106 may be a single layer or a stacked layer of plural films using the above-described material.

For example, in the case of using silicon oxide for the insulating film 106, the insulating film 106 can be formed using a mixed gas of silane and oxygen, a mixed gas of TEOS (tetraethoxysilane) and oxygen, or the like by a vapor deposition method such as thermal CVD, plasma CVD, atmospheric pressure CVD, or bias ECRCVD. The thickness of the insulating film 106 can be 10 nm to 1000 nm (preferably, 50 nm to 300 nm). In this case, a surface of the insulating film 106 may be densified with oxygen plasma treatment. In the case of using silicon nitride for the insulating film 106, the insulating film can be formed by a vapor deposition method such as a plasma CVD method using a mixed gas of silane and ammonia. In addition, in the case of using silicon nitride oxide for the insulating film 106, the insulating film can be formed using a mixed gas of silane and ammonium or a mixed gas of silane and nitrogen oxide by a vapor deposition method such as plasma CVD.

Alternatively, the insulating film 106 may be formed using silicon oxide which is formed with the use of an organosilane gas by a chemical vapor deposition method. As the organosilane gas, the following silicon-containing compound can be used; tetraethoxysilane (TEOS: chemical formula, $Si(OC_2H_5)_4$); tetramethylsilane (TMS: chemical formula, $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like.

Note that in this specification, the oxynitride refers to a substance which contains more oxygen atoms than nitrogen atoms; whereas the nitride oxide refers to a substance which contains more nitrogen atoms than oxygen atoms. Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The semiconductor substrate 111 and the single crystal semiconductor substrate 101 whose surface is provided with the single crystal semiconductor layer 102 and the oxide film 103 and in which the embrittled region 104 is formed in a region at a predetermined depth from the surface of the single crystal semiconductor layer 102 (see FIGS. 1A to 1C) are bonded to each other with the insulating film 106 and the oxide film 103 interposed therebetween. Next, heat treatment is performed to cause separation at the embrittled region 104, whereby the single crystal semiconductor layer 112 can be formed over the semiconductor substrate 111 with the insulating film 106 and the oxide film 103 interposed therebetween. Note that planarization treatment may be performed on the single crystal semiconductor layer 112. The methods illustrated in FIGS. 1E and 1F may be used as methods of the above-described steps; therefore, detailed descriptions thereof are omitted.

In such a manner, an SOI substrate illustrated in FIG. 2 can be manufactured. Note that an example is described in which the insulating film 106 is provided on the semiconductor substrate 111 side; however, one embodiment of the present invention is not limited thereto, and the insulating film 106 can also be provided on the single crystal semiconductor substrate 101 side. In that case, the insulating film 106 can be formed on the oxide film 103 with which the surface of the single crystal semiconductor substrate 101 is provided.

Since the oxide film obtained by thermal oxidation treatment has smoothness, in the case of forming the insulating film 106 on the oxide film, the smoothness of the insulating film 106 can be also improved. Accordingly, the single crystal semiconductor substrate and the semiconductor substrate can be bonded to each other favorably. Alternatively, in the case of forming the insulating film 106 on the semiconductor substrate 111 side, even when the surface of the semiconductor substrate 111 has unevenness, the insulating film 106 can serve as a planarization film. Accordingly, the single crystal semiconductor substrate and the semiconductor substrate can be bonded to each other favorably.

FIG. 3 illustrates a structure in which the single crystal semiconductor layer 112 is provided over the semiconductor substrate 111 with an oxide film 114 and the oxide film 103 interposed therebetween. The oxide film 114 can be formed by performing thermal oxidation treatment on the semiconductor substrate 111 in a similar manner to the oxide film 103. Thermal oxidation treatment may be performed by dry oxidation; however, oxidation in an oxidizing atmosphere to which halogen is added is preferably performed. As a gas for adding halogen to an oxidizing atmosphere, one or plural kinds of gases selected from HCl, HF, $NF_3$, HBr, $Cl_2$, DCE (Dichloroethylene), $ClF_3$, $BCl_3$, $F_2$, $Br_2$, and the like can be used. The thickness of the oxide film 114 to be formed is 10 nm to 1000 nm (preferably, 50 nm to 300 nm). The use of trans-1,2-dichloroethylene as dichloroethylene is effective in the case where thermal oxidation treatment is desired to be performed at a low temperature because the decomposition temperature of trans-1,2-dichloroethylene is low. Note that, as well as trans-1,2-dichloroethylene, cis-1,2-dichloroethylene, 1,1-dichloroethylene, or a mixed gas of at least two kinds of the gases may be used.

In this manner, impurities such as a metal are gettered into the oxide film 114 formed on the surface of the semiconductor substrate 111 by the action of halogen contained in an oxidizing atmosphere, and thus the concentration of the impurities such as a metal in the semiconductor substrate 111 is reduced or the impurities are removed. Further, by formation of the oxide film 103 by thermal oxidation treatment, the crystallinity of the single crystal semiconductor substrate 101 is improved. It has an advantageous effect on the case where the surface of the single crystal semiconductor substrate 101 is subjected to chemical mechanical polishing treatment.

The semiconductor substrate 111 and the single crystal semiconductor substrate 101 whose surface is provided with the single crystal semiconductor layer 102 and the oxide film 103 and in which the embrittled region 104 is formed in a region at a predetermined depth from the surface of the single crystal semiconductor layer 102 (see FIGS. 1A to 1C) are bonded to each other with the oxide film 114 and the oxide film 103 interposed therebetween. Next, heat treatment is performed to cause separation at the embrittled region 104, whereby the single crystal semiconductor layer 112 can be formed over the semiconductor substrate 111 with the oxide film 114 and the oxide film 103 interposed therebetween. Note that planarization treatment may be performed on the single crystal semiconductor layer 112. The methods illustrated in FIGS. 1E and 1F may be used as methods of the above-described steps; therefore, detailed descriptions thereof are omitted. In such a manner, an SOI substrate illustrated in FIG. 3 can be manufactured.

When the oxide films are formed on the surfaces of the single crystal semiconductor substrate 101 and the semiconductor substrate 111 by thermal oxidation treatment, the oxide films each serve as a blocking layer which prevents contamination of the single crystal semiconductor layer 112 due to diffusion of impurities from the semiconductor substrate 111 into the single crystal semiconductor layer 112. Further, since the oxide films obtained by thermal oxidation treatment have smoothness, the single crystal semiconductor substrate and the semiconductor substrate can be bonded to each other favorably.

FIG. 4 illustrates a structure in which the single crystal semiconductor layer 112 is provided over the semiconductor substrate 111 with the oxide film 114, the insulating film 106, and the oxide film 103 interposed therebetween. The oxide film 114 and the insulating film 106 can be formed by the method described above. Note that the insulating film 106 can be provided over one or both of the single crystal semiconductor substrate 101 and the semiconductor substrate 111.

The semiconductor substrate 111 and the single crystal semiconductor substrate 101 whose surface is provided with the single crystal semiconductor layer 102 and the oxide film 103 and in which the embrittled region 104 is formed in a region at a predetermined depth from the surface of the single crystal semiconductor layer 102 (see FIGS. 1A to 1C) are bonded to each other with the oxide film 114, the insulating film 106, and the oxide film 103 interposed therebetween. Next, heat treatment is performed to cause separation at the embrittled region 104, whereby the single crystal semiconductor layer 112 can be formed over the semiconductor substrate 111 with the oxide film 114, the insulating film 106, and the oxide film 103 interposed therebetween. Note that planarization treatment may be performed on the single crystal semiconductor layer 112. The methods illustrated in FIGS. 1E and 1F may be used as methods of the above-described steps; therefore, detailed descriptions thereof are omitted. In such a manner, an SOI substrate illustrated in FIG. 4 can be manufactured.

When the oxide films are formed on the surfaces of the single crystal semiconductor substrate 101 and the semiconductor substrate 111 by thermal oxidation treatment, and further, the insulating film 106 is formed, the oxide films each serve as a blocking layer which prevents contamination of the single crystal semiconductor layer 112 due to diffusion of impurities from the semiconductor substrate 111 into the single crystal semiconductor layer 112. Further, since the oxide films obtained by thermal oxidation treatment have smoothness, by formation of the insulating film 106 on the oxide film, the smoothness of the insulating film 106 can also be improved. Accordingly, the single crystal semiconductor substrate and the semiconductor substrate can be bonded to each other favorably.

In this embodiment, as a method for forming the oxide film 114 containing a chlorine atom, the case is described in which thermal oxidation treatment is performed in an oxidizing atmosphere containing hydrogen chloride or dichloroethylene; however, the method is not limited thereto. For example, by performing thermal oxidation treatment on the semiconductor substrate 111 in an oxidizing atmosphere, the oxide film 114 (e.g. SiOx) is formed on the surface of the semiconductor substrate 111, and then a chlorine atom may be included in the oxide film 114 by adding chlorine ions accelerated by an electric field with the use of an ion doping apparatus or an ion implantation apparatus. Alternatively, after treatment of the surface of the semiconductor substrate 111 with a hydrogen chloride (HCl) solution, thermal oxidation treatment may be performed in an oxidizing atmosphere.

This embodiment can be implemented in free combination with any of the other embodiments.

An ion irradiation method, which is one feature of the present invention, is considered below.

In this embodiment, a single crystal semiconductor substrate is irradiated with ions which are derived from hydrogen (H) (hereinafter, such ions are referred to as "hydrogen ion species"). More specifically, a hydrogen gas or a gas containing hydrogen in its composition is used as a source material, hydrogen plasma is generated, and the single crystal semiconductor substrate is irradiated with the hydrogen ion species in the hydrogen plasma.

(Ions in Hydrogen Plasma)

Hydrogen ion species such as $H^+$, $H_2^+$, and $H_3^+$ exist in the above-described hydrogen plasma. Here, reaction equations for reaction processes (genration processes and distribution processes) of the hydrogen ion species are listed below.

$$e+H \rightarrow e+H^+ +e \quad (1)$$

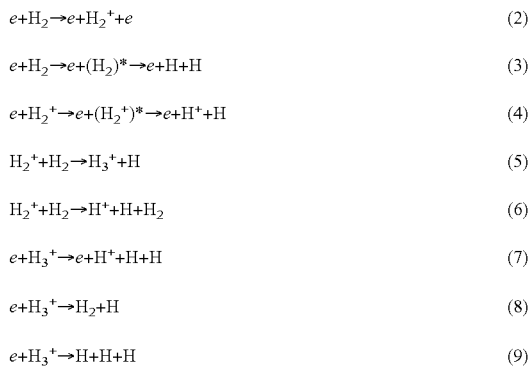

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 5:
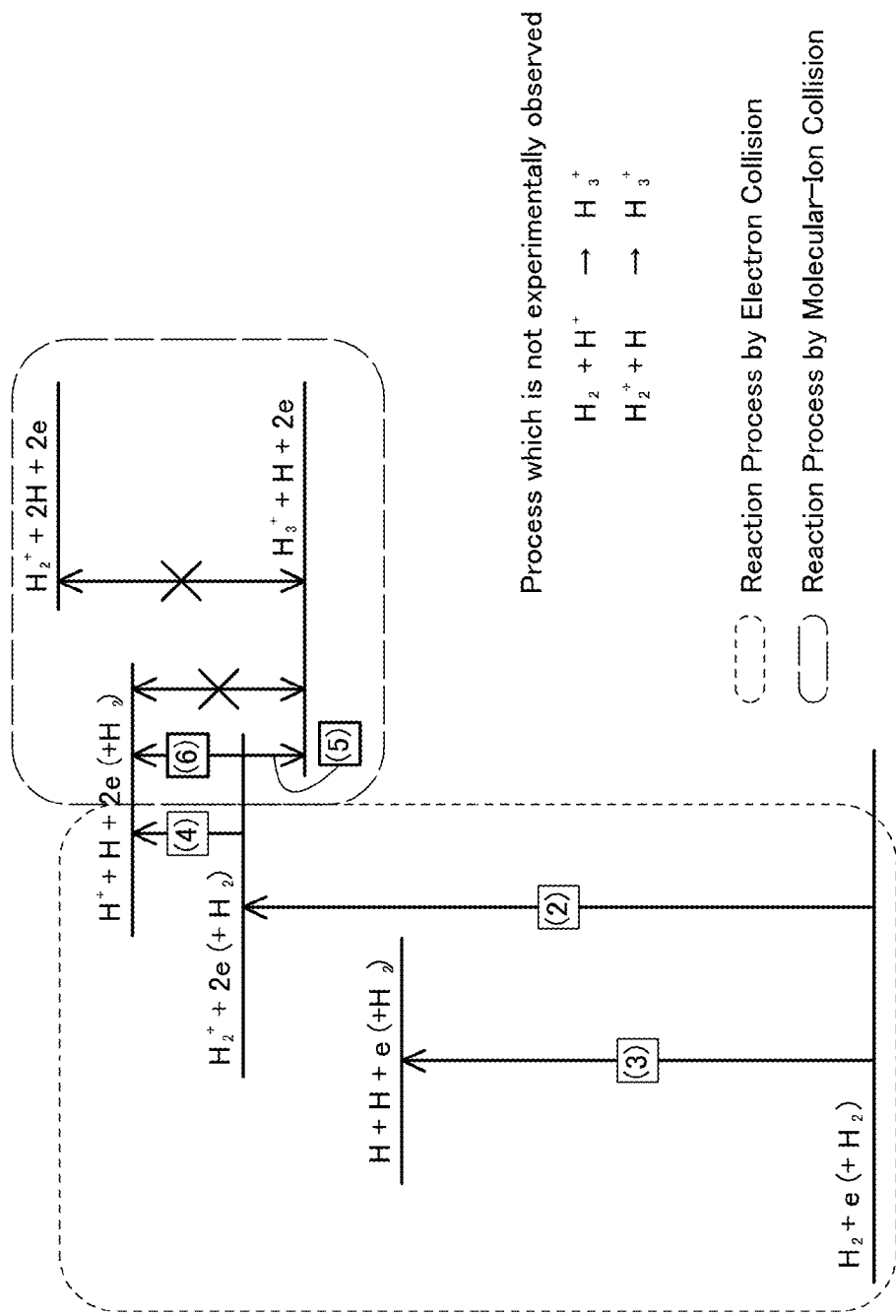
FIG. 5 is an energy diagram of hydrogen ion species.

FIG. 5 is an energy diagram which schematically illustrates some of the above-described reactions. Note that the energy diagram in FIG. 5 is merely a schematic energy diagram and does not exactly depict the relationships of energies of the reactions.

(Generation Process of H3$^+$)

As described above, $H_3^+$ are mainly generated through the reaction process represented by the reaction equation (5). On the other hand, as a reaction which competes with the reaction equation (5), there is the reaction process represented by the reaction equation (6). For the amount of $H_3^+$ to be increase, at the least, it is necessary that the reaction of the reaction equation (5) occur more often than the reaction of the reaction equation (6) (note that, since there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

Force is exerted on a charged particle by an electric field, and the charged particle gains kinetic energy. The kinetic energy corresponds to the amount of decrease in potential energy due to an electric field. For example, the amount of kinetic energy that a given charged particle gains before colliding with another particle is equal to the difference between a potential energy at a potential before the charged particle moves and a potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in the situation where the electric field is low, the amount of $H_3^+$ tends to be increased.

(Difference Depending on Ion Source)

Figure 6:
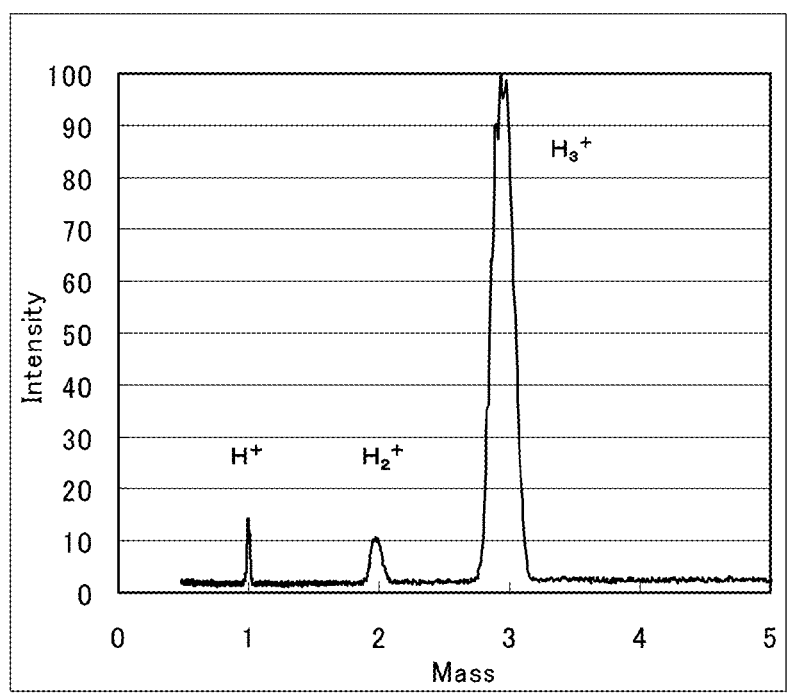
FIG. 6 is a diagram showing the results of ion mass spectrometry.

Here, an example in which the proportions of ion species (particularly, the proportion of $H_3^+$) are different is described. FIG. 6 is a graph showing the results of mass spectrometry of ions which are generated from a 100% hydrogen gas (with the pressure of an ion source of $4.7 \times 10^{31\ 2}$ Pa). Note that this mass spectrometry was performed by measurement of ions which were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of a spectrum which corresponds to the number of ions. In FIG. 6, the number of ions with different masses is expressed as a relative proportion where the number of ions with a mass of 3 is defined as 100. It can be seen from FIG. 6 that the ratio between ion species which are generated from the ion source, i.e., the ratio between $H^-$, $H_2^-$, and $H_3^-$, is approximately 1:1:8. Note that ions at such a ratio can also be generated by an ion doping apparatus which includes a plasma source portion (ion source) which generates plasma, an extraction electrode which extracts an ion beam from the plasma, and the like.

Figure 7:
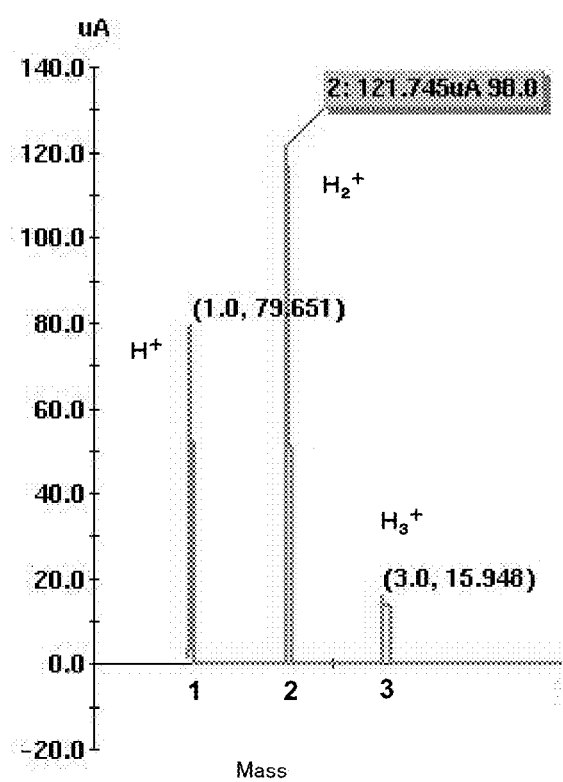
FIG. 7 is a diagram showing the results of ion mass spectrometry
Figure 9:
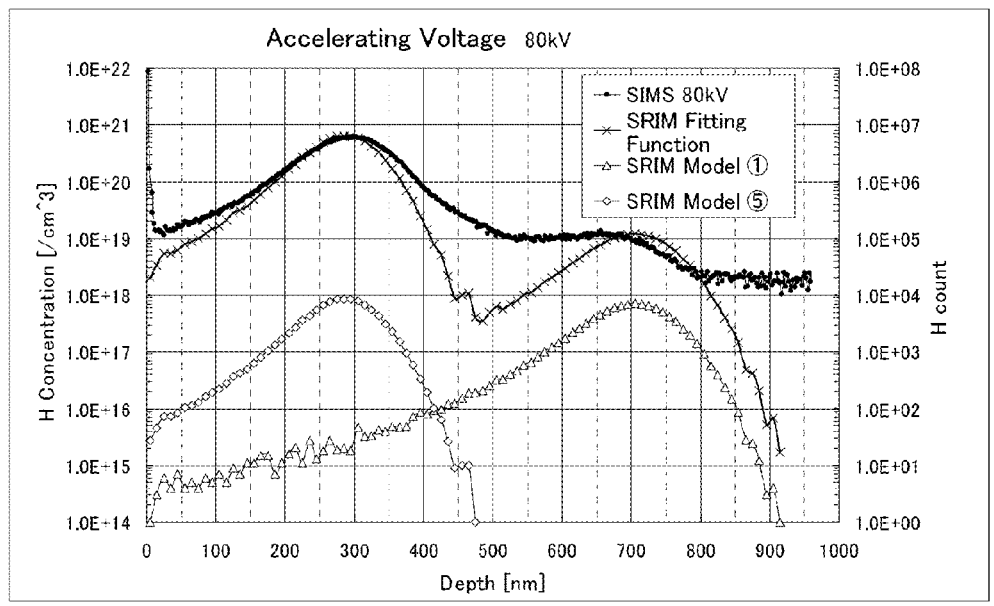
FIG. 9 is a diagram showing the profile (measured values, calculated values, and fitting functions) of hydrogen atoms in the depth direction when the accelerating voltage is 80 kV.
Figure 10:
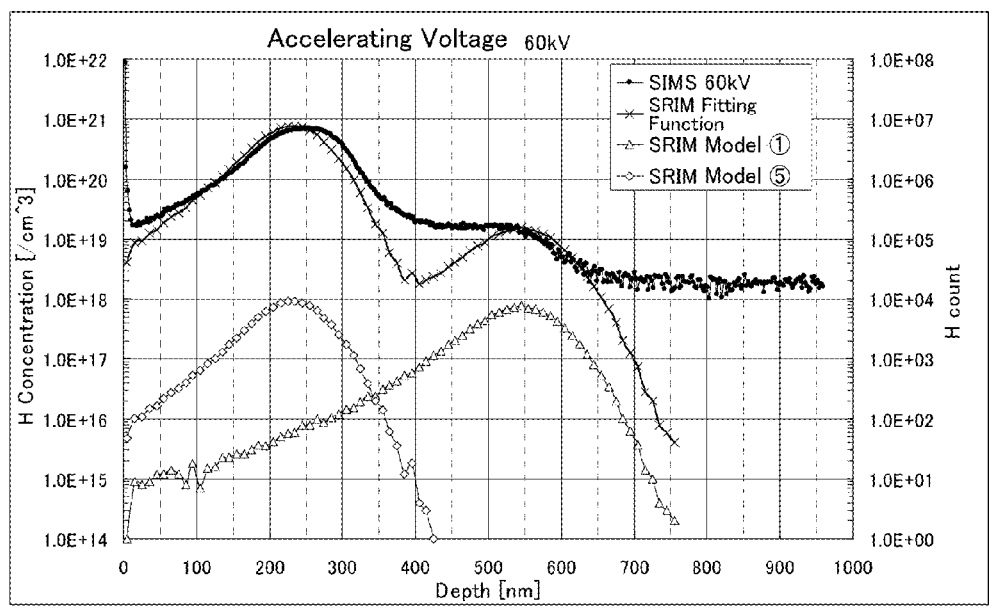
FIG. 10 is a diagram showing the profile (measured values, calculated values, and fitting functions) of hydrogen atoms in the depth direction when the accelerating voltage is 60 kV.

FIG. 7 is a graph showing the results of mass spectrometry of ions which are generated from $PH_3$ when an ion source different from that for the case of FIG. 6 is used and the pressure of the ion source is about $3 \times 10^{-3}$ Pa. The results of this mass spectrometry focus on the hydrogen ion species. In addition, the mass spectrometry was performed by measurement of ions which were extracted from the ion source. As in FIG. 9, the horizontal axis of FIG. 10 represents ion mass, and the mass 1 peak, the mass 2 peak, and the mass 3 peak correspond to $H^+$, $H_2^+$, and $H_3^+$, respectively. The vertical axis represents the intensity of a spectrum which corresponds to the number of ions. It can be seen from FIG. 7 that the ratio between ion species in plasma, i.e., the ratio between $H^+$, $H_2^+$, and $H_3^+$, is about 37:56:7. Note that, although FIG. 10 shows the data obtained when the source gas is $PH_3$, the ratio between the hydrogen ion species is substantially the same when a 100% hydrogen gas is used as a source gas, as well.

In the case of the ion source from which the data shown in FIG. 7 is obtained, $H_3^+$, of $H^+$, $H_2^+$, and $H_3^+$, is generated at a proportion of only about 7%. On the other hand, in the case of the ion source from which the data shown in FIG. 6 is obtained, the proportion of $H_3^+$ ions can be greater than or equal to 50% (under the above-described conditions, about 80%). This is thought to result from the pressure and electric field inside a chamber, which is clearly shown in the above consideration.

($H_3^+$ Irradiation Mechanism)

In the case where plasma that contains a plurality of ion species as shown in FIG. 6 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ which has twice the mass. In addition, a calculation based on Model 4 was performed with the $H_3^+$ replaced by $H^+$ which has three times the mass. Furthermore, a calculation based on Model 3 was performed with the $H_2^+$ replaced by $H^+$ which has half the kinetic energy, and a calculation based on Model 5, with the $H_3^+$ replaced by $H^+$ which has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 8:
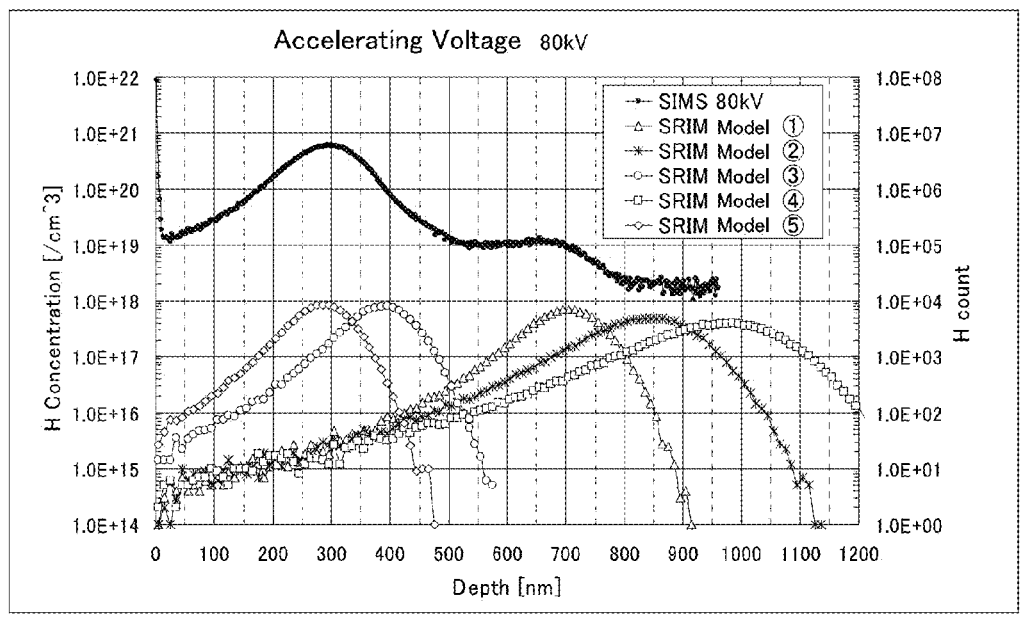
FIG. 8 is a diagram showing the profile (measured values and calculated values) of hydrogen atoms in the depth direction when the accelerating voltage is 80 kV.

FIG. 8 shows the calculation results obtained when irradiation with the hydrogen ion species (irradiation with 100,000 atoms for H) is performed using Models 1 to 5. FIG. 8 also shows the hydrogen concentration (secondary ion mass spectrometry (SIMS) data) in an Si substrate irradiated with the hydrogen ion species of FIG. 6. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents the depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only approximately several electron volts, it is thought that the contribution of each of Models 2 and 4 is small because $H_2^+$ and $H_3^+$ mostly split into $H^+$ or H by colliding with Si atoms.

Figures 11, 12:
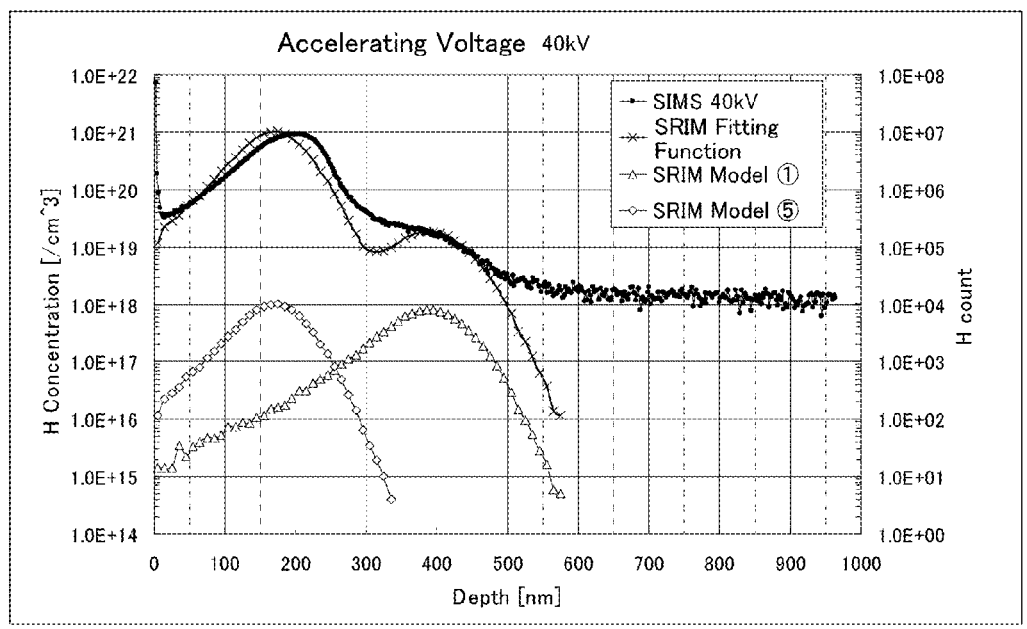
FIG. 11 is a diagram showing the profile (measured values, calculated values, and fitting functions) of hydrogen atoms in the depth direction when the accelerating voltage is 40 kV.
FIG. 12 is a list of ratios of fitting parameters (hydrogen atom ratios and hydrogen ion species ratios)

Accordingly, Models 2 to 4 will not be considered hereinafter. FIG. 9, FIG. 10, and FIG. 11 each show the calculation results obtained in the case where irradiation with the hydrogen ion species (irradiation with 100,000 atoms for H) is performed with the use of Models 1 and 5. FIG. 9, FIG. 10, and FIG. 11 also each show the hydrogen concentration (SIMS data) in an Si substrate irradiated with the hydrogen ion species of FIG. 6 and the simulation results fitted to the SIMS data (hereinafter referred to as a "fitting function"). Here, FIG. 9 shows the case where the accelerating voltage is 80 kV; FIG. 10, the case where the accelerating voltage is 60 kV; and FIG. 11, the case where the accelerating voltage is 40 kV. Note that the results of calculations performed with the use of Models 1 and 5 are expressed on the vertical axis (right axis) as the number of hydrogen atoms, and the SIMS data and the fitting function are expressed on the vertical axis (left axis) as the density of hydrogen atoms. The horizontal axis represents the depth from the surface of an Si substrate.

The fitting function is obtained using the calculation formula given below, in consideration of Models 1 and 5. Note that, in the calculation formula, X and Y represent fitting parameters and V represents volume.

[Fitting Function]=$X/V$×[Data of Model 1]+$Y/V$×[Data of Model 5]

In consideration of the ratio between ion species used for actual irradiation ($H^+$:$H_2^+$:$H_3^+$ is about 1:1:8), the contribution of H2+ (i.e., Model 3) should also be considered; however, Model 3 is excluded from the consideration given here for the following reasons.

1. Since the amount of hydrogen introduced through the irradiation process represented by Model 3 is lower than that added through the irradiation process of Model 5, there is no significant influence even if Model 3 is excluded from the consideration (no peak appears in the SIMS data either).

2. Model 3, the peak position of which is close to that of Model 5, is likely to be obscured by channeling (movement of atoms due to crystal lattice structure) which occurs in Model 5.

That is, it is difficult to estimate fitting parameters for Model 3. This is because this simulation assumes amorphous Si and the influence due to crystallinity is not considered.

FIG. 12 lists the above fitting parameters. At any of the acceleration voltages, the ratio of the amount of H introduced according to Model 1 to that introduced according to Model 5 is approximately 1:42 to 1:45 (the amount of H in Model 5, when the amount of H in Model 1 is defined as 1, is approximately greater than or equal to 42 and less than or equal to 45), and the ratio of the number of ions used for irradiation, $H^+$ (Model 1) to that of $H_3^+$ (Model 5) is approximately 1:14 to 1:15 (the amount of $H_3^+$ in Model 5, when the amount of $H^+$ in Model 1 is defined as 1, is approximately 14 to 15). Considering that Model 3 is not considered and the calculation assumes amorphous Si, it can be said that values close to that of the ratio between ion species used for actual irradiation ($H^+$:$H_2^+$:$H_3^-$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 6. For example, since $H_3^+$ splits into $H^+$, H, and the like to be introduced into a substrate, ion introduction efficiency can be improved compared with the case of irradiation mainly with $H^+$ or $H_2^+$. This leads to improvement in productivity of semiconductor substrates. In addition, since the kinetic energy of H⁺ or H after $H_3^+$ splits tends to be low, $H_3^+$ is suitable for manufacture of thin semiconductor layers.

Note that, in this specification, a method is described in which an ion doping apparatus that is capable of irradiation with the hydrogen ion species as shown in FIG. 6 is used in order to efficiently perform irradiation with $H_3^+$. Ion doping apparatuses are inexpensive and excellent for use in treatment of large area. Therefore, by irradiation with $H_3^+$ using such an ion doping apparatus, significant effects such as improvement in semiconductor characteristics, and increase in area, reduction in costs, and increase in productivity can be obtained. On the other hand, if first priority is given to irradiation with $H_3^+$, there is no need to interpret the present invention as being limited to the use of an ion doping apparatus.

Embodiment 2

In this embodiment, a method for manufacturing an SOI substrate which is different from that in the above-described embodiment will be described with reference to drawings. Specifically, a case of using a single crystal semiconductor substrate whose corners (edges) are rounded (having edge roll-off (ERO)) will be described. In addition, a case of repeatedly using (reusing) a single crystal semiconductor substrate will be described with reference to drawings. Note that, in this embodiment, elements similar to those in the above-described embodiment are indicated by the same reference numerals, and detailed descriptions thereof are omitted.

Figure 13A:
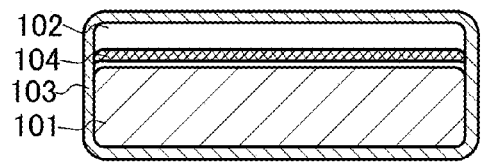
FIGS. 13A to 13I are views illustrating an example of a method for manufacturing an SOI substrate.

First, the single crystal semiconductor substrate 101 (here, a single crystal silicon substrate) whose surface is provided with the oxide film 103 and in which the embrittled region 104 is formed in a region at a predetermined depth from the surface is prepared (FIG. 13A). The methods illustrated in FIGS. 1A to 1C may be used as methods of FIG. 13A; therefore, detailed descriptions thereof are omitted.

In this embodiment, as illustrated in FIG. 13A, the corners (edges) of the single crystal semiconductor substrate 101 are rounded; thus, the oxide film 103 is formed on the surface of the edges.

Figure 13B:
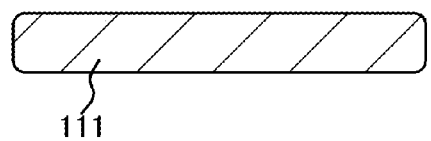
Figure 13C:
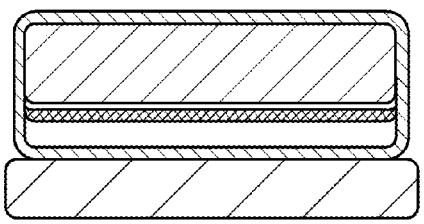

Next, the semiconductor substrate 111 is prepared (FIG. 13B), and bonding is performed so that a single crystal semiconductor layer 102 formed over the single crystal semiconductor substrate and one of surfaces of the semiconductor substrate 111 face each other with the oxide film 103 interposed therebetween (FIG. 13C).

Figure 13D:
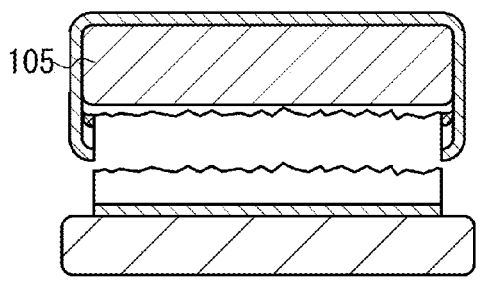

Next, heat treatment is performed to cause separation at the embrittled region 104, so that the single crystal semiconductor layer 112 is formed over the semiconductor substrate 111 with the oxide film 103 interposed therebetween (FIG. 13D).

Figure 13F:
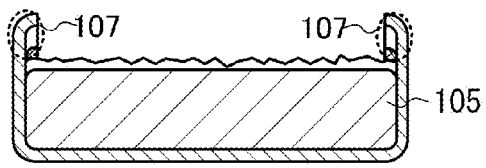
Figure 13E:

Through the above-described steps, the single crystal semiconductor layer 112 can be formed over the semiconductor substrate 111 with the oxide film 103 interposed therebetween (FIG. 13E). Note that, in the case where the surface of the single crystal semiconductor layer 112 is uneven, planarization treatment is preferably performed on the surface before a device is formed using the SOI substrate. In a similar manner to planarization treatment of FIG. 1F, the planarization treatment can be performed by one or a combination of plural methods of treatment for improving planarity and treatment for recovering crystallinity. Planarization treatment makes it possible to reduce crystal defects in and on the surface of the single crystal semiconductor layer 112 and recover the crystallinity.

The methods described in above Embodiment 1 may be used as methods of FIGS. 13A to 13E; therefore, detailed descriptions thereof are omitted.

Next, a step of repeatedly using the separated single crystal semiconductor substrate 105 (a semiconductor substrate reprocessing treatment) will be described.

In some cases, bonding between the separated single crystal semiconductor substrate 105 and the semiconductor substrate 111 is not performed sufficiently at the edges of the single crystal semiconductor substrate 105 due to the edge roll-off. As a result, the edges of the single crystal semiconductor substrate 105 are not separated at the edges of the embrittled region 104, and the oxide film 103 and the like remain in some cases (FIG. 13F).

Figure 13G:
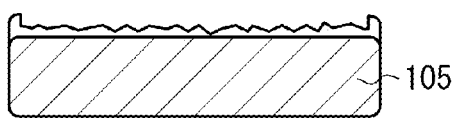

Therefore, residues 107 at the edges of the single crystal semiconductor substrate 105 are removed (FIG. 13G). The residues 107 can be removed by wet etching treatment. Specifically, wet etching is performed using a mixed solution of hydrofluoric acid, ammonium fluoride, and surfactant (e.g., product name: LAL500, manufactured by Stella Chemifa Corporation) as an etchant.

Further, the embrittled region 104 into which hydrogen ions are introduced can be removed by wet etching using an organic alkaline aqueous solution typified by tetramethylammonium hydroxide (TMAH). By such treatment, steps due to the residues at the edges of the single crystal semiconductor substrate 105 are reduced.

Figure 13H:
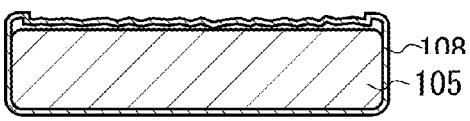

Next, by performing thermal oxidation treatment on the single crystal semiconductor substrate 105, an oxide film 108 is formed on the surface of the single crystal semiconductor substrate 105 (see FIG. 13H). After that, the oxide film 108 is removed. As thermal oxidation treatment, oxidation in an oxidizing atmosphere to which halogen is added is preferably performed. As a gas for adding halogen to an oxidizing atmosphere, one or more kinds of gases selected from HCl, HF, $NF_3$, HBr, $Cl_2$, DCE (Dichloroethylene), $ClF_3$, $BCl_3$, $F_2$, $Br_2$, or the like can be used. In this embodiment, it is preferable to perform thermal oxidation treatment in an atmosphere containing HCl at 0.5 vol % to 10 vol % (preferably 3 vol %) with respect to oxygen, at temperatures of 900° C. to 1150° C. (typically, 1000° C.). Treatment time may be 0.1 hours to 6 hours, and preferably, 0.5 hours to 1 hour. The thickness of the oxide film 108 which is formed is 10 nm to 1000 nm (preferably 50 nm to 300 nm), for example, 200 nm.

By performing thermal oxidation treatment at such a temperature range, impurities such as a metal contained in the single crystal semiconductor substrate 101 can be removed. That is, even when impurities such as a metal generated at the time of manufacturing the SOI substrate are contained in the single crystal semiconductor substrate 101, by the action of halogen, the impurities such as a metal turn into volatile chloride, and then are released into an air phase, thereby being removed from the single crystal semiconductor substrate 101. Since thermal oxidation treatment can be performed by the method illustrated in FIG. 1B, detailed description thereof is omitted.

Figure 13I:
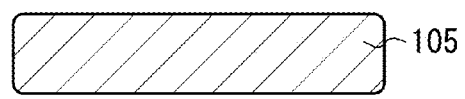
Figure 14A:
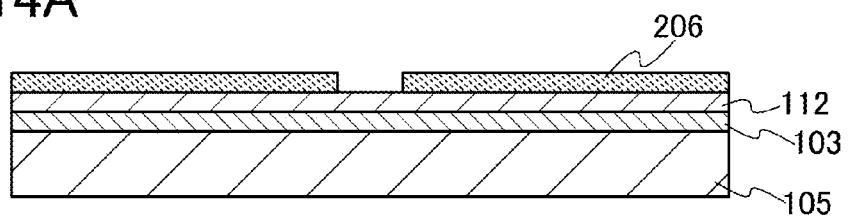
FIGS. 14A to 14E are cross-sectional views illustrating an example of a method for manufacturing a transistor.
Figure 14B:
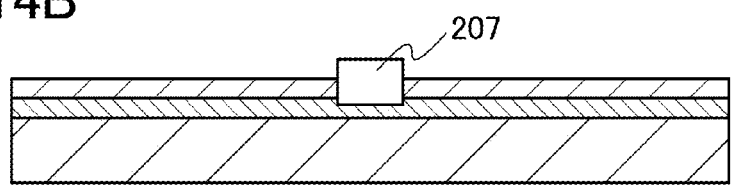
Figure 14C:
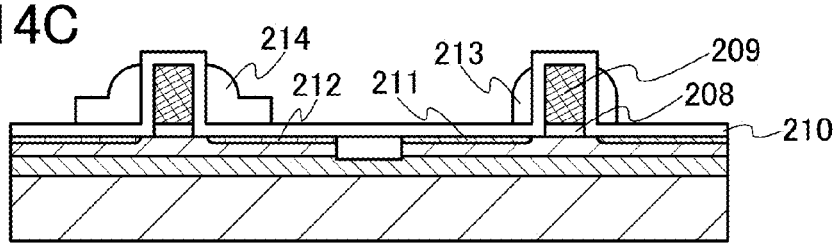
Figure 14D:
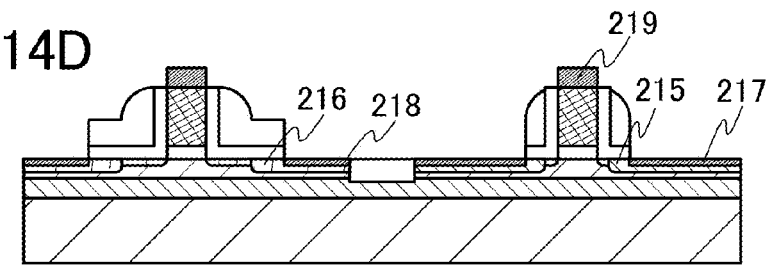
Figure 14E:
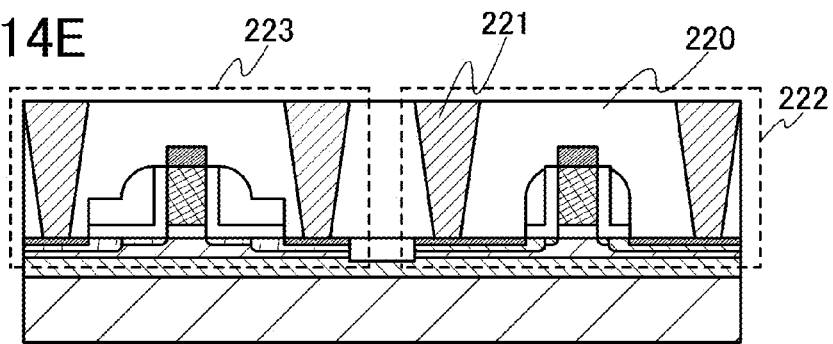

After removing the oxide film 108, planarization treatment is performed on the single crystal semiconductor substrate (see FIG. 13I). As planarization treatment, one or a combination of plural methods of treatment for improving planarity of the single crystal semiconductor substrate 105 and treatment for recovering the crystallinity is preferably performed. By treatment for improving planarity, crystal defects on the surface of the single crystal semiconductor layer 112 can be reduced. Further, by treatment for recovering the crystallinity, the crystal defects in the single crystal semiconductor layer 112 can be eliminated and the distortion of the single crystal semiconductor layer 112 can be relieved.

As treatment for improving planarity, one or a combination of plural methods of CMP treatment and etching treatment can be performed. As etching treatment, dry etching or wet etching can be used. Examples of etching gases that can be used in dry etching treatment include: chloride gases such as boron chloride, silicon chloride, and carbon tetrachloride; a chlorine gas; fluoride gases such as sulfur fluoride and nitrogen fluoride; an oxygen gas; and the like. In wet etching treatment, as an etchant, for example, a tetramethylammonium hydroxide (abbreviation: TMAH) solution can be used. As treatment for recovering crystallinity, heat treatment is performed at 500° C. to 700° C. The heat treatment at 500° C. to 700° C. can be performed by using an RTA apparatus, a resistance heating furnace, or a microwave heating apparatus. As the RTA apparatus, a GRTA apparatus, or an LRTA apparatus can be used.

Through the above-described steps, the single crystal semiconductor substrate 105 of which crystal defects are reduced and crystallinity is high can be obtained. In the case of manufacturing an SOI substrate using the single crystal semiconductor substrate 105 on which reprocessing treatment has been performed, the SOI substrate can be manufactured from the step illustrated in FIG. 1A.

Such reprocessing treatment makes it possible to manufacture an SOI substrate whose crystal defects are reduced even in the case where the SOI substrate is manufactured using the single crystal semiconductor substrate 105. In addition, the single crystal semiconductor substrate is repeatedly used by reprocessing treatment thereof, whereby cost can be reduced.

This embodiment can be implemented in free combination with any of the other embodiments.

Embodiment 3

In this embodiment, a method for manufacturing a semiconductor device using an SOI substrate manufactured in Embodiment 1 or 2 will be described. Here, an example of forming a CMOS structure as a semiconductor device will be described with reference to FIGS. 14A to 14E. Note that, in this embodiment, elements similar to those in the above-described embodiments are indicated by the same reference numerals, and detailed descriptions thereof are omitted.

According to Embodiment 1, the single crystal semiconductor layer 112 of an SOI substrate can have a thickness of 100 nm or smaller. When the single crystal semiconductor layer 112 has a thickness of is 100 nm or smaller, it is thinner than the maximum depth of a depletion layer in a channel formation region of a transistor, and outstanding electrical characteristics of the transistor are brought about. The layer of the channel formation region of the transistor is depleted sufficiently, whereby favorable subthreshold swing, threshold voltage, or the like can be obtained. Further, when a CMOS structure is formed by a complementary combination of an n-channel transistor and a p-channel transistor, fast switching speed can be obtained.

First, an SOI substrate is obtained in accordance with Embodiment 1, and then a protective layer 206 which serves as a mask for forming an element isolation insulating layer is formed over the single crystal semiconductor layer 112. This step is illustrated in a process cross-sectional view of FIG. 14A. A silicon oxide film, a silicon nitride film, or the like is used as the protective layer 206.

Note that a p-type impurity such as boron, aluminum, or gallium is preferably added to the single crystal semiconductor layer 112 in order to control threshold voltage. For example, the single crystal semiconductor layer 112 may be doped with boron as a p-type impurity at a concentration of greater than or equal to $5\times10^{17}$ cm$^{-3}$ and less than or equal to $1\times10^{18}$ cm$^{-3}$.

Next, etching is performed using the protective layer 206 as a mask to remove exposed part of the single crystal semiconductor layer 112 and part of the oxide film 103 thereunder. Then, a silicon oxide film is stacked by a chemical vapor deposition method using TEOS. This silicon oxide film is thickly deposited so that the single crystal semiconductor layer 112 is embedded. Then, after the silicon oxide film stacked over the single crystal semiconductor layer 112 is removed by polishing, the protective layer 206 is removed; thus, an element isolation insulating layer 207 is left. This step is illustrated in a process cross-sectional view of FIG. 14B.

Next, a first insulating film is formed, a gate electrode 209 having a polysilicon film containing a conductive material is formed over the first insulating film, and the first insulating film is etched using the gate electrode 209 as a mask to form a gate insulating layer 208. The gate insulating layer 208 is a single layer of a film containing silicon oxide, silicon nitride oxide, silicon nitride, hafnium oxide, aluminum oxide, or tantalum oxide obtained by a PECVD method, a sputtering method, or the like; or a stacked layer of those films. The gate insulating layer 208 can be formed to have a thin thickness of, for example, 20 nm to cover the surface of the single crystal semiconductor layer 112 by a PECVD method. Alternatively, the gate insulating layer 208 may be formed in such a manner that the surface of the single crystal semiconductor layer 112 is oxidized or nitrided by high-density plasma treatment. The high-density plasma treatment is performed using, for example, a mixed gas of a rare gas such as He, Ar, Kr, or Xe, and oxygen, nitrogen oxide, ammonia, nitrogen, hydrogen, or the like. In this case, when extraction of plasma is performed by a microwave, high-density plasma with a low electron temperature can be generated. The surface of the single crystal semiconductor layer 112 is oxidized or nitrided by oxygen radicals (OH radicals may be included) or nitrogen radicals (NH radicals may be included) which are generated by such high-density plasma, whereby an insulating film is formed to have a thickness of 1 nm to 50 nm, and preferably 5 nm to 30 nm, so as to be in contact with the single crystal semiconductor layer 112. As described in Embodiment 1, the surface of the single crystal semiconductor layer is sufficiently planarized by planarization treatment; thus, sufficient gate withstand voltage can be obtained even if an insulating film with a thickness of 20 nm is used as the gate insulating layer 208. This step is illustrated in a process cross-sectional view of FIG. 14C.

Next, a second insulating film 210 which covers the gate electrode 209 is formed; a region to be an nFET (Field Effect Transistor) is doped with arsenic (As) or the like to form a first impurity region 211 with a shallow junction depth; and a region to be a pFET is doped with boron (B) or the like to form a second impurity region 212 with a shallow junction depth. Moreover, sidewall insulating layers 213 and 214 are formed. The width of the sidewall insulating layer 214 of the region to be a pTFT is larger than that of the sidewall insulating layer 213 of the region to be an nFET. This step is illustrated in a process cross-sectional view of FIG. 14C.

Next, the second insulating film 210 is partially etched to expose top surface of the gate electrode 209, the first impurity region 211, and the second impurity region 212. Then, a region to be an nFET is doped with As or the like to form a third impurity region 215 with a deep junction depth, and a region to be a pFET is doped with B or the like to form a fourth impurity region 216 with a deep junction depth. Then, heat treatment for activation (800° C. to 1100° C.) is performed. Next, a cobalt film is formed as a metal film for forming a silicide. Then, heat treatment such as RTA (at 500° C. for one minute) is performed to form a silicide from silicon of a part in contact with the cobalt film. After that, the cobalt film is selectively removed to form silicides 217, 218, and 219. Then, heat treatment is performed at a temperature higher than the heat treatment for forming the silicide to reduce the resistance of the silicide portions. This step is illustrated in a process cross-sectional view of FIG. 14D.

Next, an interlayer insulating film 220 is formed, and contact plugs 221 reaching the third impurity region 215 with a deep junction depth and the fourth impurity region 216 with a deep junction depth are formed. Thus, an nFET 222 and a pFET 223 can be manufactured using the single crystal semiconductor layer 112 bonded to the semiconductor substrate 111. This step is illustrated in a process cross-sectional view of FIG. 14E.

The nFET 222 and the pFET 223 are complementarily combined to form a CMOS structure.

Through the above-described steps, transistors can be manufactured using an SOI substrate according to one embodiment of the present invention. A single crystal semiconductor layer of an SOI substrate according to one embodiment of the present invention has few crystal defects and a planarized surface and is thinned to a thickness of less than or equal to 50 nm. Accordingly, transistors with excellent characteristics such as low driving voltage, high electron field effect mobility, and a low subthreshold value can be manufactured over the SOI substrate. Furthermore, a plurality of high performance transistors with less variation in characteristics between the transistors can be formed over the same substrate. In other words, with the use of an SOI substrate according to one embodiment of the present invention, non-uniformity of the important characteristic value as transistor characteristics, such as threshold voltage or mobility, can be suppressed, and higher performance is possible. Note that in this embodiment, the description is made with the use of the SOI substrate having a structure in which the oxide film 103, and the single crystal semiconductor layer 112 are formed over the semiconductor substrate 111 in this order; however, the present invention is not construed as being limited thereto.

Embodiment 4

In this embodiment, an example of a method for manufacturing a semiconductor device having a high-performance and highly reliable semiconductor element with high yield, which is different from the method described in Embodiment 3 will be described. Note that in a method for manufacturing a semiconductor device described in this embodiment, an opening for connection between a semiconductor layer and a wiring is formed in a self-aligned manner. Note that in this embodiment, elements similar to those in the above embodiments are indicated by the same reference numerals, and detailed descriptions thereof are omitted.

First, an SOI substrate manufactured by the method described in Embodiment 1 or the like is prepared (not illustrated). In this embodiment, description will be made with the use of an SOI substrate having a structure in which the oxide film 114, the oxide film 103, and the single crystal semiconductor layer 112 are formed over the semiconductor substrate 111 in this order. After the semiconductor layer over the semiconductor substrate is patterned into an island shape to form an island-shaped semiconductor layer 606, an insulating layer 608 serving as a gate insulating layer and a conductive layer serving as a gate electrode (or a wiring) are formed in this order. In this embodiment, the conductive layer serving as a gate electrode has a two-layer structure; however, the present invention is not limited thereto. Here, the insulating layer 608 can be formed using a material such as silicon oxide, silicon oxynitride, silicon nitride oxide, or silicon nitride by a CVD method, a sputtering method, or the like. The thickness of the insulating layer 608 may be greater than or equal to about 5 nm and less than or equal to about 100 nm. The conductive layer can be formed using a material such as tantalum (Ta), tungsten (W), titanium (Ti), molybdenum (Mo), aluminum (Al), copper (Cu), chromium (Cr), or niobium (Nb) by a CVD method, a sputtering method, or the like. The total thickness of the conductive layer may be greater than or equal to about 100 nm and less than or equal to about 500 nm. Note that in this embodiment, the case will be described in which the insulating layer 608 is formed using silicon oxide (with a thickness of 20 nm), a lower layer of the conductive layer is formed using tantalum nitride (with a thickness of 50 nm), and an upper layer of the conductive layer is formed using tungsten (with a thickness of 200 nm).

Note that an impurity element imparting p-type conductivity such as boron, aluminum, or gallium or an impurity element imparting n-type conductivity such as phosphorus, or arsenic may be added to the semiconductor layer in order to control a threshold voltage of a transistor. For example, in the case of adding boron as an impurity element imparting p-type conductivity, boron may be added at a concentration of greater than or equal to $5\times10^{16}$ cm$^{-3}$ and less than or equal to $1\times10^{17}$ cm$^{-3}$. Further, hydrogenation treatment may be performed on the semiconductor layer. The hydrogenation treatment is performed, for example, at 350° C. in a hydrogen atmosphere for about two hours.

Next, the conductive layer serving as a gate electrode is patterned. Note that in the method for manufacturing a thin film transistor in this embodiment, patterning is performed on the conductive layer at least twice. Here, first patterning is performed. As a result of this, a conductive layer 610 and a conductive layer 612 which are larger than the gate electrode which is to be formed finally are formed. Here, the term "larger" herein means a size with which a resist mask for forming the gate electrode in a second patterning can be formed in accordance with the position of the conductive layer 610 and the conductive layer 612. Note that the first patterning and the second patterning may be performed on a region of the conductive layer overlapping with the island-shape semiconductor layer 606 and both the first patterning and the second patterning do not need to be performed on an entire surface of the conductive layer.

Figure 15A:
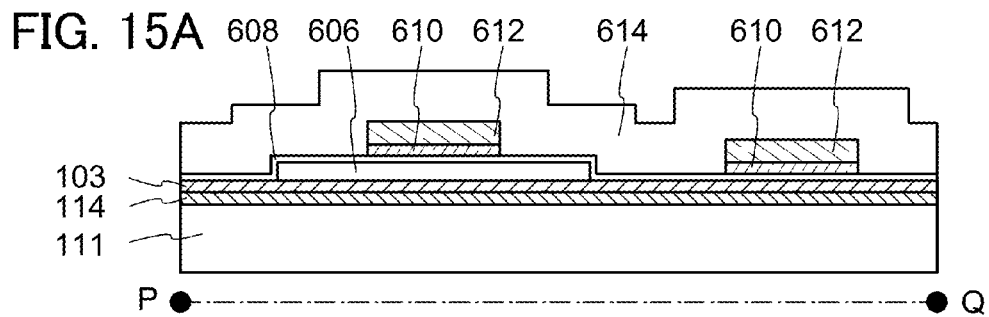
FIGS. 15A to 15D are cross-sectional views illustrating an example of a method for manufacturing a transistor.
Figure 17A:
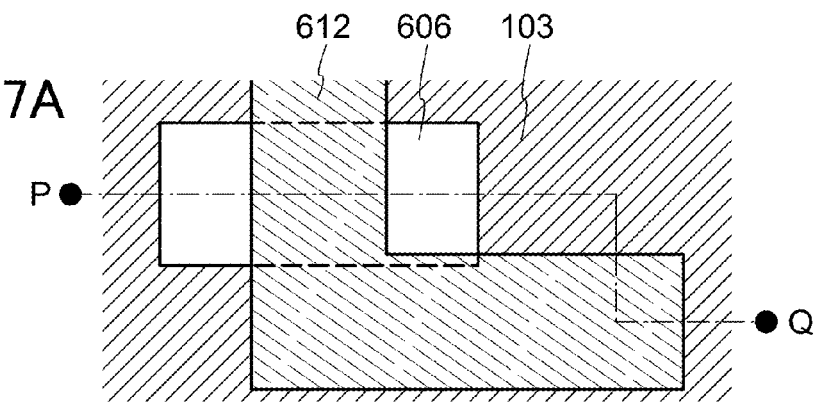
FIGS. 17A to 17D are plan views illustrating an example of a method for manufacturing a transistor.

After that, an insulating layer 614 is formed so as to cover the insulating layer 608, the conductive layer 610, and the conductive layer 612 (see FIG. 15A and FIG. 17A). Here, the insulating layer 614 can be formed using a material such as silicon oxide, silicon oxynitride, silicon nitride oxide, silicon nitride, hafnium oxide or aluminum oxide by a CVD method, a sputtering method, or the like. The thickness of the insulating layer 614 is preferably greater than or equal to about 0.5 μm and less than or equal to about 2 μm. In this embodiment, as an example, the case will be described where the insulating layer 614 is formed using silicon oxide (with a thickness of 1 μm). Note that in this embodiment, description is made with the use of an SOI substrate having a structure in which the oxide film 114, the oxide film 103, and the semiconductor layer are formed in this order over the semiconductor substrate 111; however, the present invention is not construed as being limited thereto.

Figure 15B:
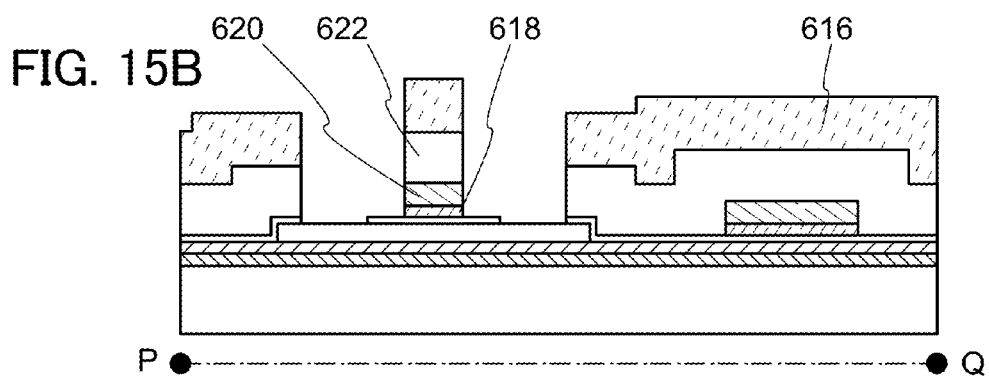
Figure 15C:
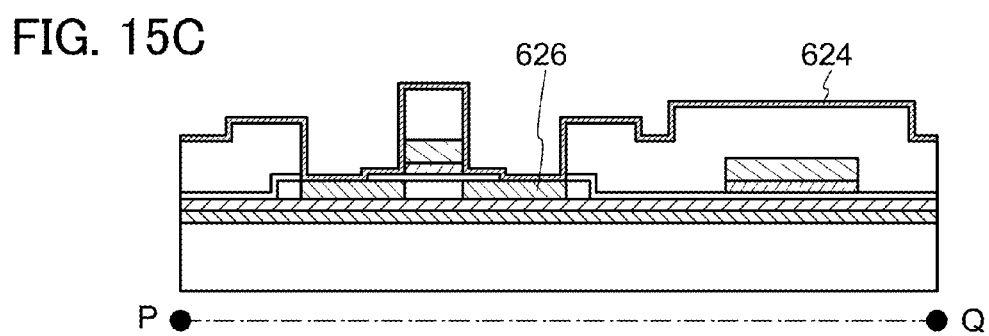
Figure 15D:
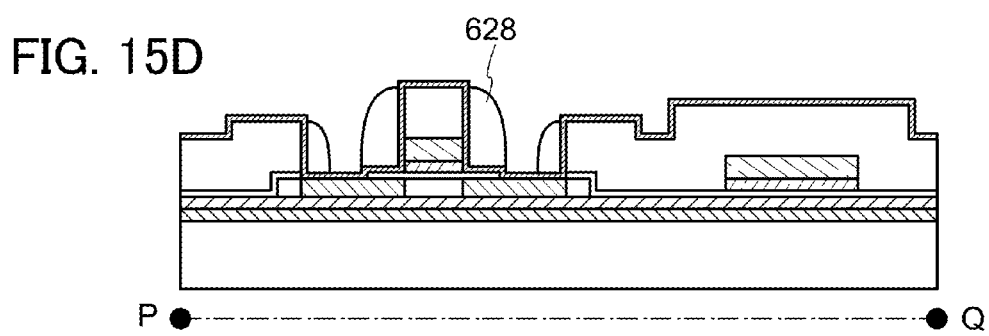
Figure 16C:
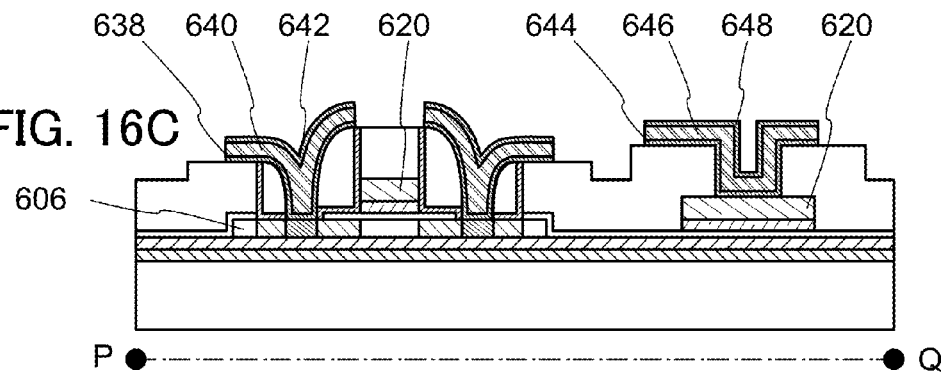
Figure 17B:
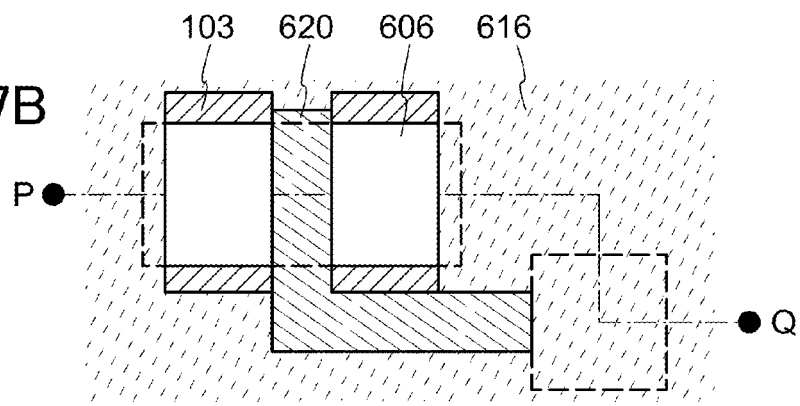

Note that FIG. 15A is a view corresponding to a cross section taken along a line P-Q of FIG. 17A which is a plane view. Similarly, FIG. 15B, FIG. 15D and FIG. 16C are views corresponding to cross sections taken along lines P-Q of FIG. 17B, FIG. 17C and FIG. 17D, respectively. In the plane views illustrated in FIG. 17A to 17D, some components in the corresponding cross-sectional views are omitted for simplicity.

Next, a resist mask 616 for forming a gate electrode, which is used in patterning, is formed over the insulating layer 614. The patterning corresponds to the second patterning of the first patterning and the second patterning which are performed on the conductive layer. The resist mask 616 can be formed in such a manner that a resist material which is a photosensitive substance is applied, and then a pattern is exposed to light. After formation of the resist mask 616, the conductive layer 610, the conductive layer 612 and the insulating layer 614 are patterned with the use of the resist mask 616. Specifically, the insulating layer 614 is selectively etched to form an insulating layer 622, and then the conductive layer 610 and the conductive layer 612 are selectively etched to form a conductive layer 618 and a conductive layer 620 which serve as a gate electrode (see FIG. 15B and FIG. 17B). Here, when the insulating layer 614 is selectively etched, part of the insulating layer 608 which serves as a gate insulating layer is also etched at the same time.

Next, the resist mask 616 is removed, and then, an insulating layer 624 is formed so as to cover the island-shaped semiconductor layer 606, the insulating layer 608, the conductive layer 618, the conductive layer 620, the insulating layer 622, and the like. The insulating layer 624 serves as a barrier layer at the time of forming sidewalls later. Although the insulating layer 624 can be formed using a material such as silicon oxide, silicon oxynitride, silicon nitride oxide, silicon nitride, hafnium oxide, aluminum oxide or tantalum oxide, it is preferable to form the insulating layer 624 using a material having etching selectivity to a material used for the sidewalls later so that the insulating layer 624 serves as a barrier layer. The thickness of the insulating layer 624 may be greater than or equal to about 10 nm and less than or equal to about 200 nm. In this embodiment, the insulating layer 624 is formed using silicon nitride (with a thickness of 50 nm).

After formation of the insulating layer 624, an impurity element imparting one conductivity type is added to the island-shaped semiconductor layer 606 using the conductive layer 618, the conductive layer 620, the insulating layer 622, and the like as masks. In this embodiment, an impurity element imparting n-type conductivity (e.g. phosphorus or arsenic) is added to the island-shaped semiconductor layer 606. By addition of the impurity element, impurity regions 626 are formed in the island-shaped semiconductor layer 606 (see FIG. 15C). Note that in this embodiment, after formation of the insulating layer 624, an impurity element imparting n-type conductivity is added; however, the present invention is not limited thereto. For example, after or before removal of the resist mask, the impurity element may be added, and then the insulating layer 624 may be formed. An impurity element to be added can also be an impurity element imparting p-type conductivity.

Figure 17C:
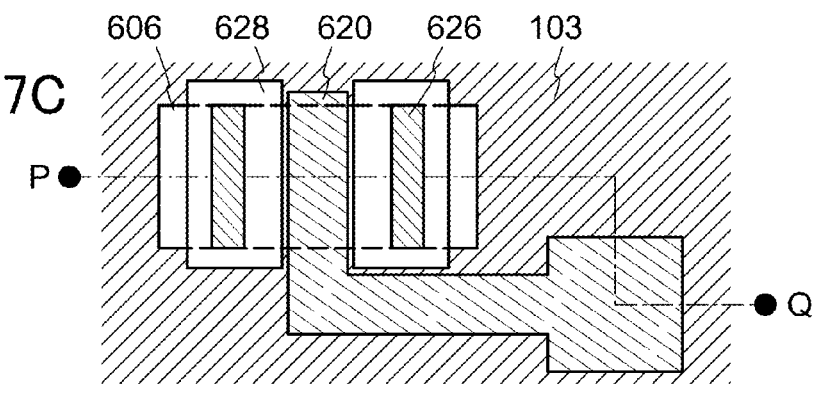

Next, sidewalls 628 are formed (see FIG. 15D and FIG. 17C). The sidewalls 628 can be formed in such a manner that an insulating layer is formed so as to cover the insulating layer 624 and anisotropic etching mainly in a perpendicular direction is performed on the insulating layer. This is because the insulating layer is selectively etched by the above-described anisotropic etching. The insulating layer can be formed using a material such as silicon oxide, silicon oxynitride, silicon nitride oxide, silicon nitride, hafnium oxide, aluminum oxide or tantalum oxide by a CVD method, a sputtering method, or the like. Further, a film containing an organic material may be formed by a spin coating method, or the like. In this embodiment, silicon oxide is used as a material for the insulating layer. That is, the sidewalls 628 are formed using silicon oxide. In addition, as an etching gas, a mixed gas of $CHF_3$ and helium can be used, for example. Note that the step of forming the sidewalls 628 is not limited thereto.

Next, an impurity element imparting one conductivity type is added to the island-shaped semiconductor layer 606 using the insulating layer 622, the sidewalls 628, or the like as masks. Note that the impurity element which is added to the island-shaped semiconductor layer 606 has the same conductivity type as the impurity element which has been added in the previous step. Here, the impurity element is added to the island-shaped semiconductor layer 606 at a higher concentration than that of the impurity element which has been added in the previous step. That is, in this embodiment, an impurity element imparting n-type conductivity is added.

By addition of the above-described impurity element, a channel formation region 630, low-concentration impurity regions 632, and high-concentration impurity regions 634 are formed in the island-shaped semiconductor layer 606. The low-concentration impurity regions 632 each serves as an LDD (lightly doped drain) region and the high-concentration impurity regions 634 each serves as a source or a drain.

Figure 16A:
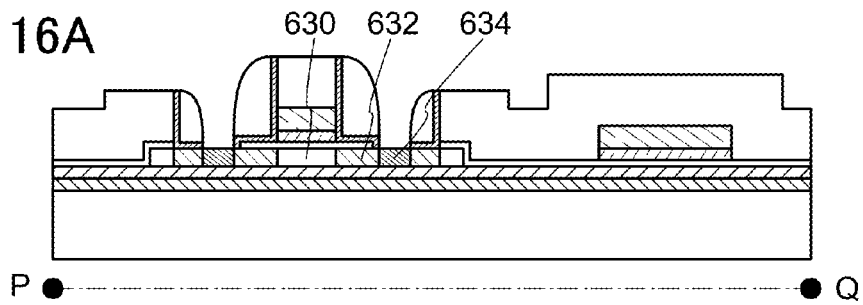
FIGS. 16A to 16C are cross-sectional views illustrating an example of a method for manufacturing a transistor.

Next, the insulating layer 624 is etched to form openings (contact holes) which reach the high-concentration impurity regions (see FIG. 16A). Since the insulating layer 622 and the sidewalls 628 are formed using silicon oxide and the insulating layer 624 is formed using silicon nitride in this embodiment, the insulating layer 624 can be selectively etched to form the openings.

Figure 16B:
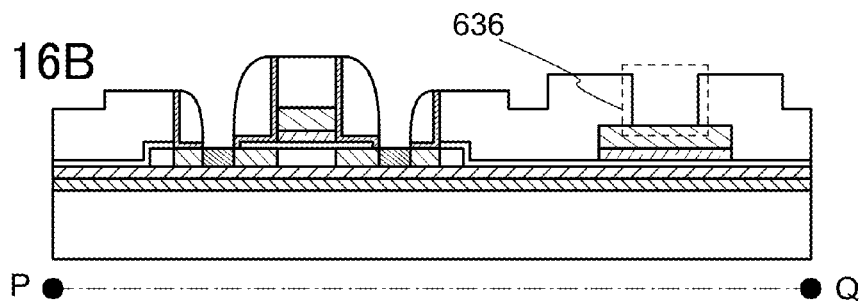

After formation of the openings which reach the high-concentration impurity regions, the insulating layer 614 is selectively etched to form an opening 636 (see FIG. 16B). The opening 636 is formed larger than the opening which reaches the high-concentration impurity region. This is because a minimum line width of the opening 636 is determined in accordance with a process rule or a design rule, while the opening which reaches the high-concentration impurity region is miniaturized by being formed in a self-aligned manner.

After that, a conductive layer, which is in contact with the high-concentration impurity regions 634 in the island-shaped semiconductor layer 606 and the conductive layer 620 through the openings which reach the high-concentration impurity regions and the opening 636, respectively, is formed. The conductive layer can be formed by a CVD method, a sputtering method, or the like. As a material of the conductive layer, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described metal as the main component or a compound containing the above-described metal may be used. The conductive layer may have a single-layer structure or a stacked-layer structure. In this embodiment, the case is described in which the conductive layer has a three-layer structure of titanium, aluminum and titanium.

Figure 17D:
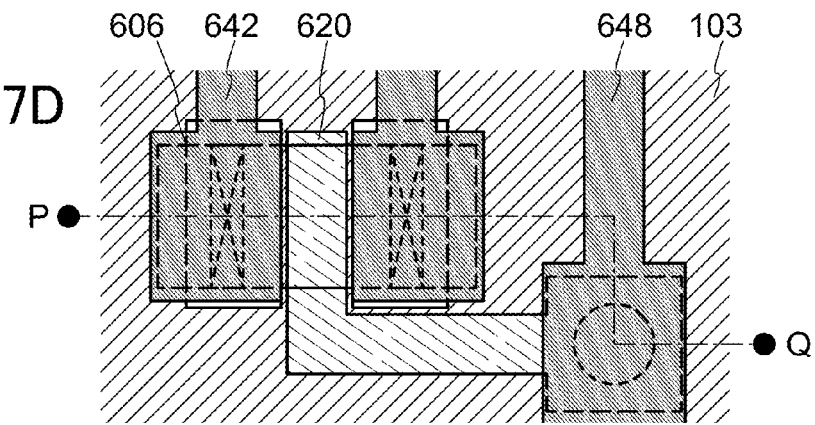

The above-described conductive layer is selectively etched to form a conductive layer 638, a conductive layer 640 and a conductive layer 642 which serve as a source or drain electrode (a source or drain wiring), a conductive layer 644, a conductive layer 646 and a conductive layer 648 which are connected to the conductive layer 620 and serve as a wiring (see FIG. 16C and FIG. 17D). Through the above steps, a thin film transistor is completed in which a connection between the island-shaped semiconductor layer 606 and the conductive layer serving as the source or drain electrode is formed in a self-aligned manner.

In this manner, a transistor can be manufactured with the use of an SOI substrate according to one embodiment of the present invention. A single crystal semiconductor layer of an SOI substrate according to one embodiment of the present invention has few crystal defects and is a single crystal semiconductor layer with reduced interface state density with the gate electrode layer. The single crystal semiconductor layer has a planarized surface and is thinned to a thickness of less than or equal to 50 nm. Accordingly, transistors with excellent characteristics such as low driving voltage, high electron field-effect mobility, and a low subthreshold value can be manufactured over the SOI substrate. Further, plural transistors with high performance and little characteristic variation between the transistors can be formed over the same substrate. In other words, with the use of an SOI substrate according to one embodiment of the present invention, nonuniformity of the important characteristic value as transistor characteristics, such as threshold voltage or mobility, can be reduced and higher performance is possible. Note that in this embodiment, the description is made with the use of the SOI substrate having a structure in which the oxide film 114, the oxide film 103, and the single crystal semiconductor layer 112 are formed over the semiconductor substrate 111 in this order; however, the present invention is not construed as being limited thereto.

Since a connection relation of the source or drain electrode can be formed in a self-aligned manner by the method described in this embodiment, a structure of the transistor can be miniaturized. That is, the degree of integration of semiconductor elements can be increased. Further, since the length of the channel or the low-concentration impurity region can be determined in a self-aligned manner, variation in channel resistance, which is a problem in miniaturization, can be suppressed. That is, transistors with excellent characteristics can be provided.

Thus, a semiconductor device with high added value can be manufactured by formation of various semiconductor elements such as transistors using the SOI substrate according to one embodiment of the present invention.

Embodiment 5

Although the methods for manufacturing a transistor are described in Embodiments 3 and 4, a semiconductor device with higher added value can be manufactured by formation of various semiconductor elements such as a capacitor and a resistor together with the transistor. Hereinafter, specific modes of semiconductor devices will be described with reference to drawings. Note that in this embodiment, elements similar to those in the above embodiments are indicated by the same reference numerals, and detailed descriptions thereof are omitted.

Figure 18:
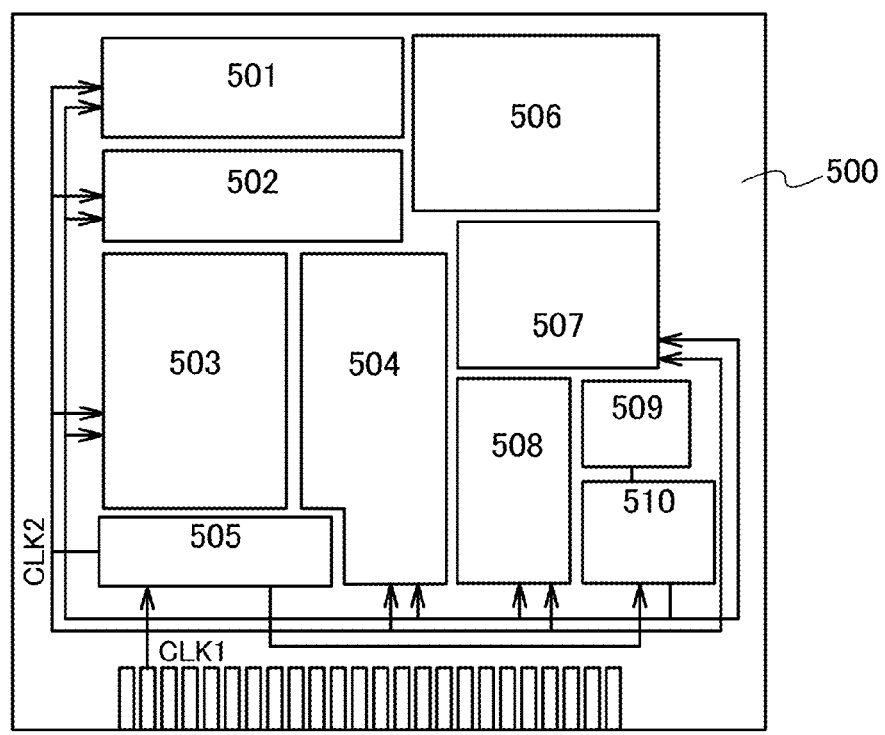
FIG. 18 is a block diagram illustrating an example of a structure of a microprocessor.

First, as an example of a semiconductor device, a microprocessor will be described. FIG. 18 is a block diagram illustrating a structural example of a microprocessor 500.

The microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

The ALU controller 502 generates a signal for controlling the operation of the arithmetic logic unit 501. While the microprocessor 500 is executing a program, the interrupt controller 504 judges an interrupt request from an external input/output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 18, the internal clock signal CLK2 is input to another circuit.

Since an integrated circuit in the microprocessor 500 is formed using the single crystal semiconductor layer 112 with reduced crystal defects and uniform crystal orientation, not only higher processing speed but also lower power consumption can be achieved.

Figure 19:
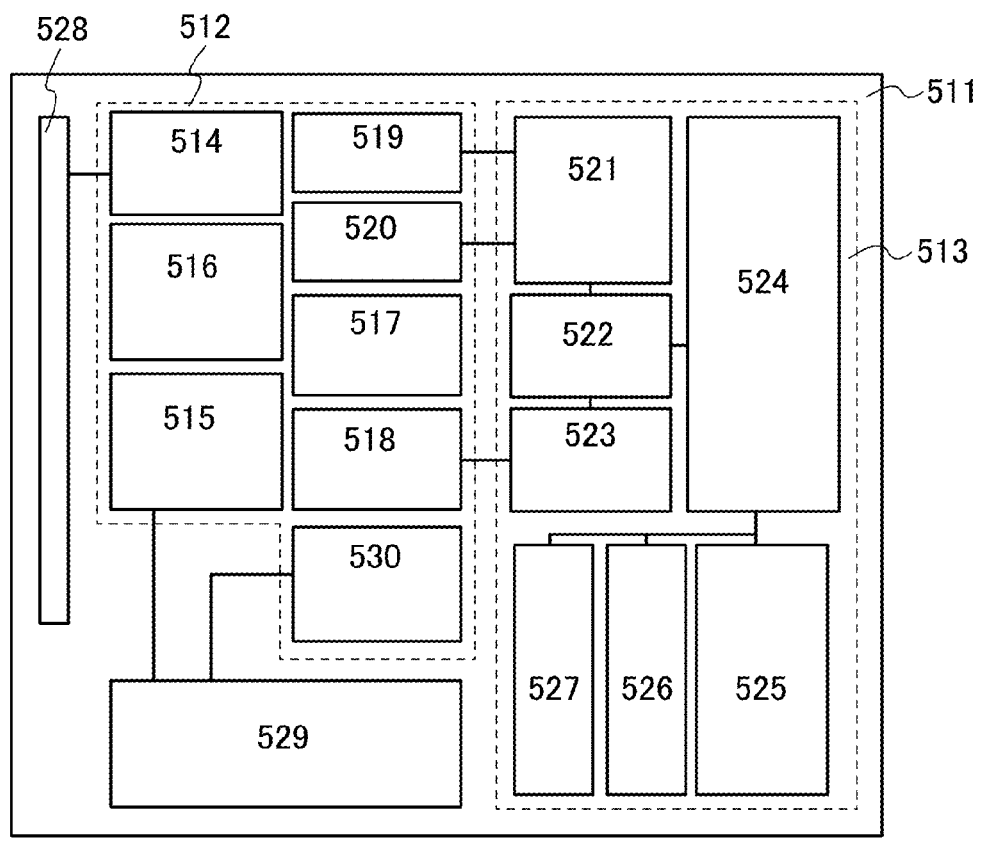
FIG. 19 is a block diagram illustrating an example of a structure of an RFCPU

Next, an example of a semiconductor device having a function of transmitting and receiving data wirelessly and also having an arithmetic function will be described. FIG. 19 is a block diagram illustrating an example of a structure of such a semiconductor device. The semiconductor device illustrated in FIG. 19 can be called a computer which operates by communicating signals with an external device by wireless communication (hereinafter the computer is referred to as an RFCPU).

As illustrated in FIG. 19, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, a CPU interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably a capacitor such as a ceramic capacitor or an electric double layer capacitor. The capacitor portion 529 is not necessarily integrated over the same substrate as the RFCPU 511 and may be incorporated into the RFCPU 511 as another component.

The reset circuit 517 generates a signal that resets the digital circuit portion 513 to be initialized. For example, the reset circuit generates a signal which rises after rise in the supply voltage with delay as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method in which a circuit dedicated to arithmetic is formed and an arithmetic process is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Since an integrated circuit in the RFCPU is formed using the single crystal semiconductor layer 112 with reduced crystal defects and uniform crystal orientation, not only higher processing speed but also lower power consumption can be achieved. Accordingly, even when the capacitor portion 529 which supplies electric power is miniaturized, long-term operation is ensured.

Embodiment 6

Figure 20A:
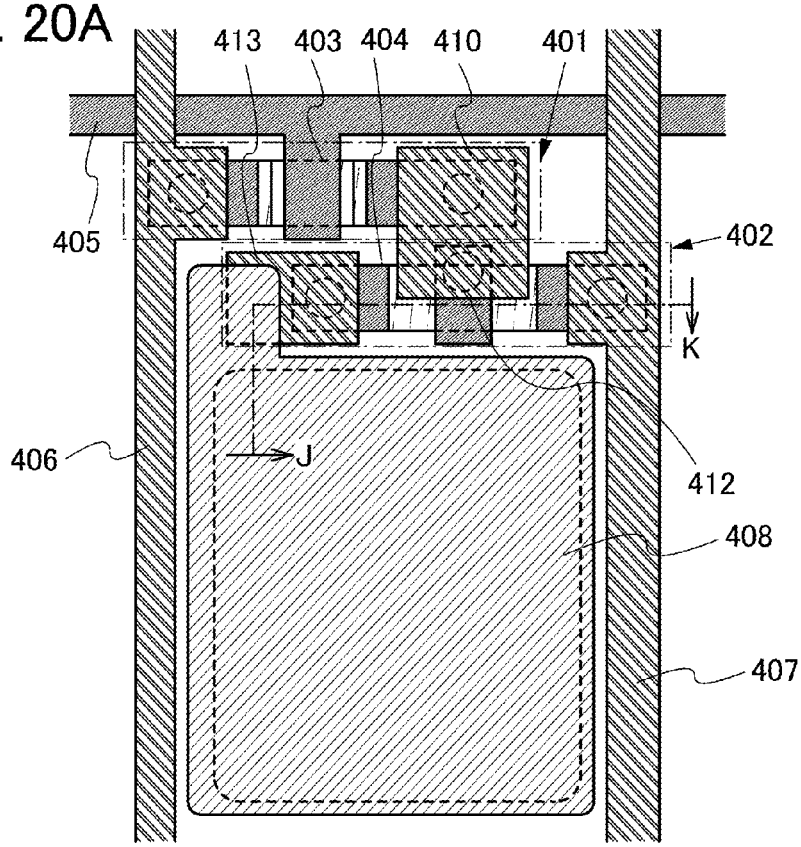
FIG. 20A is a plan view of a pixel of an electroluminescence display device and FIG. 20B is a cross-sectional view taken along a line J-K of FIG. 20A.
Figure 20B:
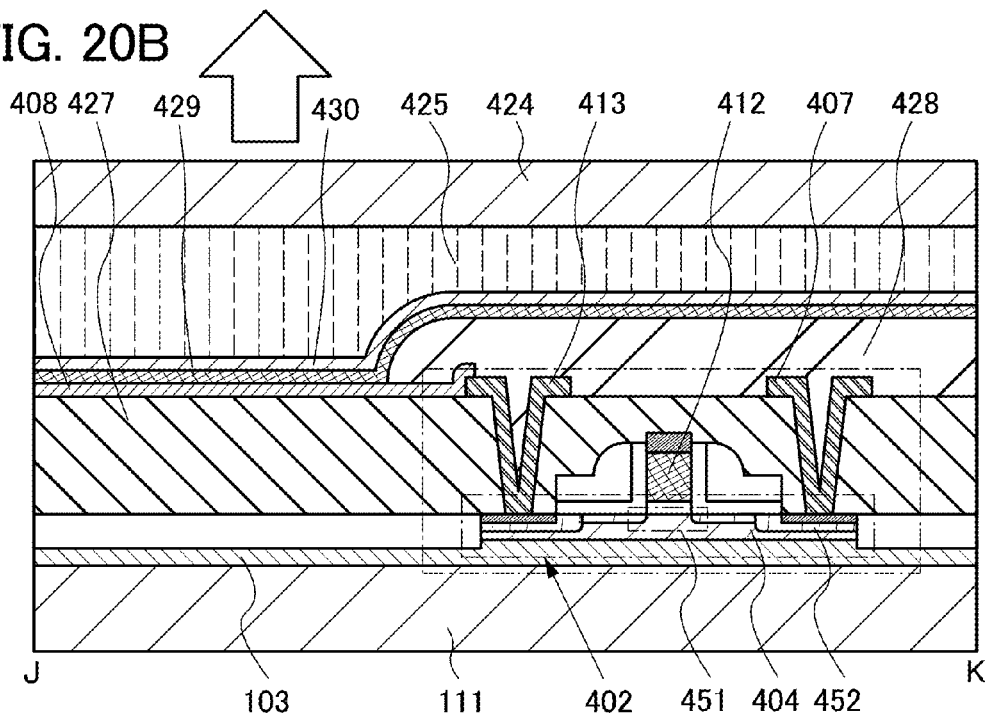

In this embodiment, an electroluminescent display device (hereinafter referred to as an "EL display device") using an SOI substrate according to one embodiment of the present invention will be described with reference to FIGS. 20A and 20B. FIG. 20A is a plan view of a pixel of an EL display device, and FIG. 20B is a cross-sectional view taken along a line J-K in FIG. 20A. FIGS. 20A and 20B illustrate the case where a top emission type structure is employed in which light is emitted in the direction of the arrows illustrated in the drawing.

As illustrated in FIG. 20A, the pixel includes a selection transistor 401 and a display control transistor 402, a scanning line 405, a signal line 406, a current supply line 407, and a pixel electrode 408. In the EL display device, each pixel is provided with a light-emitting element having a structure in which a layer including an electroluminescent material (this layer is also referred to as an EL layer) is sandwiched between a pair of electrodes. One of the electrodes of the light emitting element is the pixel electrode 408.

A single crystal semiconductor layer 403 included in the selection transistor 401 and a single crystal semiconductor layer 404 included in the display control transistor 402 are layers each of which is formed using the single crystal semiconductor layer 112 provided on the semiconductor substrate 111 according to one embodiment of the present invention, from which impurities such as a metal are removed and in which crystal defects are reduced.

Further, a channel formation region, a source region, and a drain region of the selection transistor 401 are formed using the single crystal semiconductor layer 403. A channel formation region, a source region, and a drain region of the display control transistor 402 are formed using the single crystal semiconductor layer 404.

In the selection transistor 401, a gate electrode is included in the scanning line 405, one of a source electrode and a drain electrode is included in the signal line 406, and the other thereof is formed as an electrode 410. In the display control transistor 402, a gate electrode 412 is electrically connected to the electrode 410, one of a source electrode and a drain electrode is formed as an electrode 413 which is electrically connected to the pixel electrode 408, and the other thereof is included in the current supply line 407.

The display control transistor 402 is a p-channel FET. As illustrated in FIG. 20B, a channel formation region 451 and p-type impurity regions 452 are formed in the single crystal semiconductor layer 404. Note that as an SOI substrate, an SOI substrate manufactured in Embodiments 1 and 2 is used.

An interlayer insulating film 427 is formed so as to cover the gate electrode 412 of the display control transistor 402. Over the interlayer insulating film 427, the signal line 406, the current supply line 407, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. The EL layer 429 is formed over the pixel electrode 408, and a counter electrode 430 is formed over the EL layer 429. A counter substrate 424 is provided as a reinforcing plate, and the counter substrate 424 is fixed to the semiconductor substrate 111 with a resin layer 425.

The gray scale of the EL display device can be controlled by a current driving method in which luminance of a light-emitting element is controlled by current or a voltage driving method in which luminance of a light-emitting element is controlled by voltage. In the case where transistors have characteristic values which are largely different between pixels, it is difficult to employ the current driving method; in order to employ the current driving method in such a case, a correction circuit which corrects characteristic variation is needed. However, since an SOI substrate manufactured by a method for manufacturing an SOI substrate according to one embodiment of the present invention has few crystal defects, a plurality of high-performance transistors with little variation in characteristics can be formed over the same substrate. Accordingly, an EL display device is manufactured using an SOI substrate according to one embodiment of the present invention, whereby characteristic variation of the selection transistor 401 and the display control transistor 402 between pixels is reduced; therefore, the current driving method can be employed.

Embodiment 7

A semiconductor device such as a transistor and the like can be manufactured using an SOI substrate according to one embodiment of the present invention, and a variety of electronic appliances can be completed using the semiconductor device. Since a concentration of impurities contained in a single crystal semiconductor layer provided in an SOI substrate according to one embodiment of the present invention is reduced, by using the single crystal semiconductor layer as an active layer, a semiconductor element in which leakage current is reduced and electric characteristics are improved can be manufactured. Further, since the crystal defects are reduced in the single crystal semiconductor layer, localized level density at an interface with a gate insulating layer can be reduced. Furthermore, since the single crystal semiconductor layer has high planarity, a gate insulating layer which is thin and has high withstand voltage can be formed over the single crystal semiconductor layer, and improvement in mobility or an S value or suppression of short-channel effects, of a semiconductor element to be manufactured, can be realized. That is, with the use of the SOI substrate according to one embodiment of the present invention, a highly reliable semiconductor element with high current drive capability can be manufactured. As a result, electronic appliances as end products can be manufactured with high throughput and high quality. A variety of semiconductor devices can be manufactured by using the semiconductor element. In this embodiment, a specific example will be described with reference to drawings. Note that in this embodiment, elements similar to those in the above embodiments are indicated by the same reference numerals, and detailed descriptions thereof are omitted.

Figure 21A:
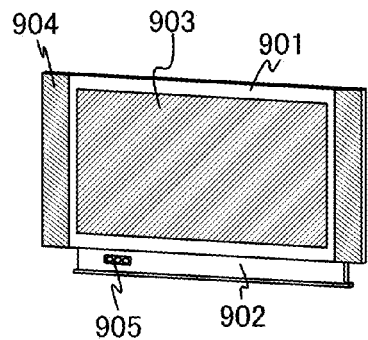
FIGS. 21A to 21F are views each illustrating an example of an electronic appliance in which an SOI substrate is used.

FIG. 21A illustrates a display device including a chassis 901, a supporting base 902, a display portion 903, a speaker portion 904, a video input terminal 905, and the like. This display device is manufactured using a transistor formed by the manufacturing method described in the other embodiments for a driver IC, the display portion 903, and the like. Note that the display device includes a liquid crystal display device, a light-emitting display device, and the like; and all the information displaying devices for computers, television reception, advertisement display, and the like. Specifically, a display, a head mount display, a reflection type projector, and the like are given.

Figure 21B:
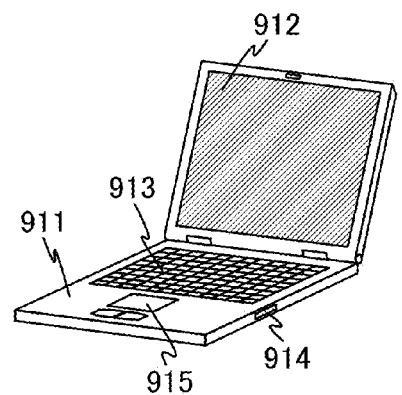

FIG. 21B illustrates a computer including a chassis 911, a display portion 912, a keyboard 913, an external connection port 914, a pointing device 915, and the like. A transistor formed according to one embodiment of the present invention can be applied not only to a pixel portion in the display portion 912 but also to a semiconductor device such as a driver IC for display, a CPU inside a main body, or a memory.

Figure 21C:
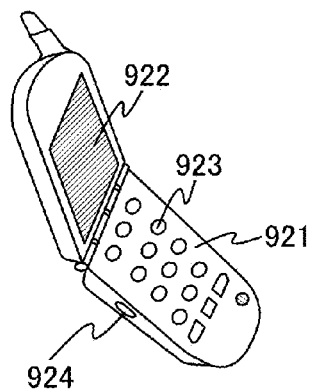

FIG. 21C illustrates a mobile phone, which is a typical example of mobile information processing terminals. This mobile phone includes a chassis 921, a display portion 922, operation keys 923, and the like. A transistor formed according to one embodiment of the present invention can be applied not only to a pixel portion in the display portion 922 or a sensor portion 924 but also to a driver IC for display, a memory, an audio processing circuit, and the like. The sensor portion 924 includes an optical sensor element, by which the luminance of the display portion 922 is controlled according to the illuminance of the sensor portion 924, and by which the lighting of the operation key 923 is controlled according to the illuminance of the sensor portion 924. Thus, the power consumption of the mobile phone can be suppressed.

The semiconductor device formed according to one embodiment of the present invention can be applied to an electronic appliance such as personal digital assistants (PDA), a digital camera, a small game machine, or a mobile sound reproducing device, in addition to the above mobile phone. For example, it is possible to apply the semiconductor device to a functional circuit such as a CPU, a memory, or a sensor; a pixel portion of those electronic appliances; or a driver IC for display thereof.

Figure 21D:
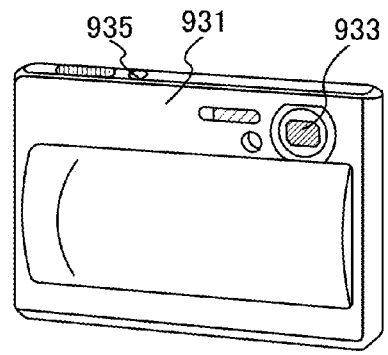
Figure 21E:
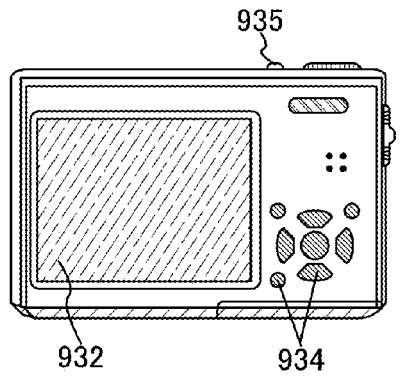

FIGS. 21D and 21E illustrate a digital camera. Note that FIG. 21E illustrates a backside of the digital camera illustrated in FIG. 21D. The digital camera includes a chassis 931, a display portion 932, a lens 933, operation keys 934, a shutter button 935, and the like. A transistor manufactured according to one embodiment of the present invention can be applied to a pixel portion of the display portion 932, a driver IC for driving the display portion 932, a memory, or the like.

Figure 21F:
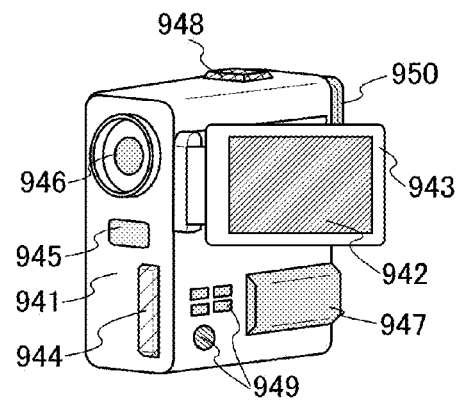

FIG. 21F illustrates a digital video camera, which includes a main body 941, a display portion 942, a chassis 943, an external connection port 944, a remote control receiving portion 945, an image receiving portion 946, a battery 947, an audio input portion 948, operation keys 949, an eyepiece portion 950, and the like. A transistor manufactured according to one embodiment of the present invention can be applied to a pixel portion of the display portion 942, a driver IC for controlling the display portion 942, a memory, a digital input processing device, or the like.

Besides, the transistor manufactured using the present invention can be applied to a navigation system, a sound reproducing device, an image reproducing device provided with a recording medium, or the like. A transistor manufactured according to one embodiment of the present invention can be applied to pixel portions of display portions of the above devices, a driver IC for controlling the display portion, a memory, a digital input processing device, a sensor portion, or the like.

Figure 22A:
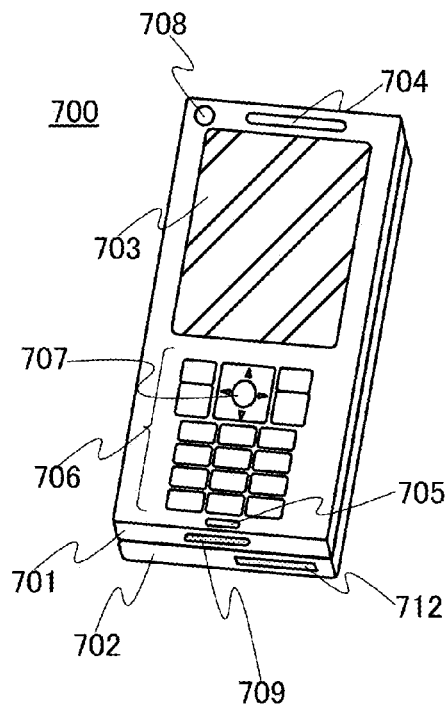
FIGS. 22A to 22C are views illustrating an example of an electronic appliance in which an SOI substrate is used.
Figure 22B:
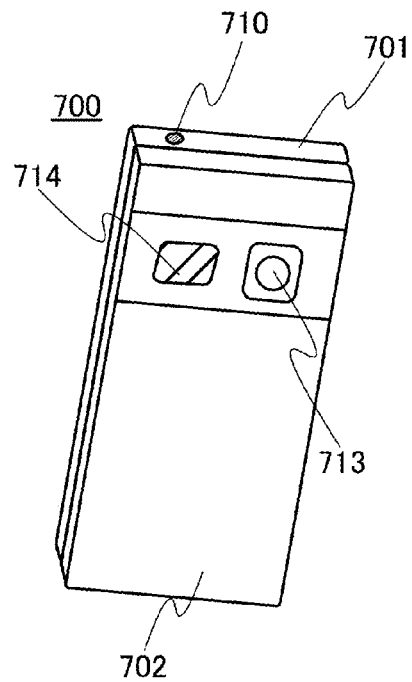
Figure 22C:
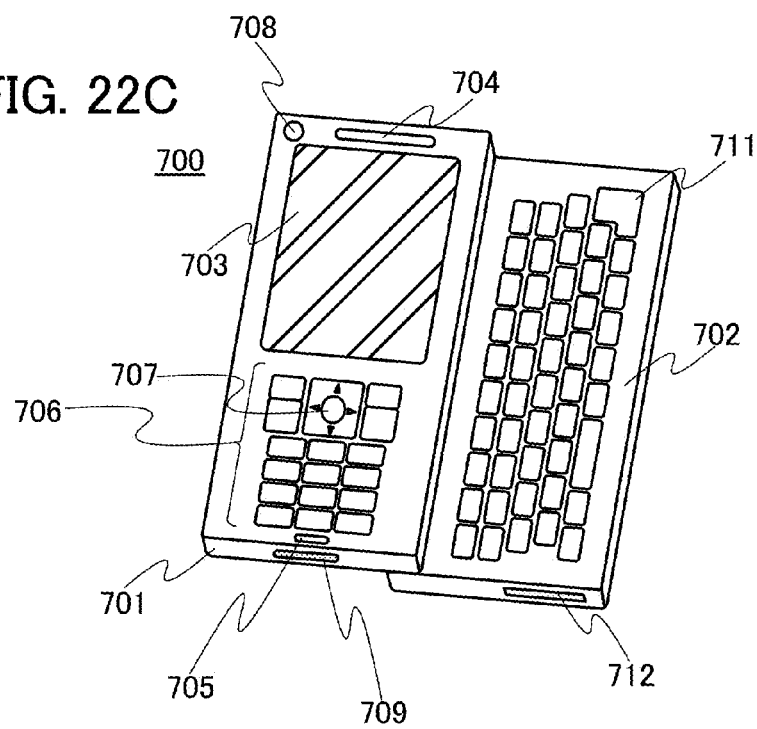

FIGS. 22A to 22C illustrate another example of a mobile phone to which one embodiment of the present invention is applied. FIG. 22A is a front view, and FIG. 22B is a rear view, and FIG. 22C is a front view in which two chassis are slid. A mobile phone 700 is a so-called smartphone which has both functions of a mobile phone and a portable information terminal, incorporates a computer, and is capable of a variety of data processing in addition to voice calls.

The mobile phone 700 has a chassis 701 and a chassis 702. The chassis 701 includes a display portion 703, a speaker 704, a microphone 705, operation keys 706, a pointing device 707, a camera lens 708, an external connection terminal 709, an earphone terminal 710, and the like. The chassis 702 includes a keyboard 711, an external memory slot 712, a rear camera 713, a light 714, and the like. In addition, an antenna is incorporated in the chassis 701. A semiconductor element manufactured according to one embodiment of the present invention can be applied to a display portion of the display portion 703, a driver IC for driving the display portion 703, a memory, an audio processing circuit, or the like. By applying the EL display device illustrated in FIGS. 20A and 20B to the display portion 703, the display portion 703 can have excellent image quality with little display unevenness.

Further, in addition to the above structure, the mobile phone 700 may incorporate a non-contact IC chip, a small memory device, or the like.

The chassis 701 and 702 which overlap with each other (see FIG. 22A) can be slid, and the chassis 701 and 702 are slid, whereby the mobile phone 700 is opened as illustrated in FIG. 22C. Since the camera lens 708 is provided in the same plane as the display portion 703, the mobile phone 700 can be used as a videophone. Further, a still image and a moving image can be taken with the rear camera 713 and the light 714, using the display portion 703 as a viewfinder.

With the use of the speaker 704 and the microphone 705, the mobile phone 700 can be used as an audio recording device (recording device) or an audio reproducing device. With the use of the operation keys 706, further, operations of incoming and outgoing of calls, simple information input such as electronic mail, scrolling of a screen, cursor movement, e.g., for selecting information to be displayed in the display portion, and the like are possible.

If much information needs to be treated in documentation, use as a portable information terminal, and the like, it is convenient to use the keyboard 711. Further, the chassis 701 and the chassis 702 which overlap with each other (see FIG. 22A) are slid, whereby the mobile phone 700 can be opened as illustrated in FIG. 22C. In the case of using the mobile phone 700 as a portable information terminal, smooth operation can be conducted by using the keyboard 711 and the pointing device 707. The external connection terminal 709 can be connected to an AC adaptor and various types of cables such as a USB cable, and charging and data communication with a personal computer or the like are possible. Further, by inserting a recording medium in the external memory slot 712, a larger amount of data can be stored and transferred.

The rear face of the chassis 702 (see FIG. 22B) is provided with the rear camera 713 and the light 714, and a still image and a moving image can be taken using the display portion 703 as a viewfinder.

Further, the mobile phone may have an infrared communication function, a USB port, a function of receiving one segment television broadcast, a non-contact IC chip, an earphone jack, or the like, in addition to the above functions and structures.

As described above, the applicable range of a semiconductor device manufactured according to one embodiment of the present invention is so wide that the semiconductor device can be applied to electronic appliances in a variety of fields with the use of an SOI substrate according to one embodiment of the present invention.

This application is based on Japanese Patent Application serial no. 2008-079557 filed with Japan Patent Office on Mar. 26, 2008, the entire contents of which are hereby incorporated by reference.

What is claimed is:

1. A method for manufacturing an SOI substrate comprising the steps of:
    forming a single crystal semiconductor layer over a first single crystal semiconductor substrate by an epitaxial growth method;
    performing a first thermal oxidation treatment on the first single crystal semiconductor substrate over which the single crystal semiconductor layer is formed to form an oxide film at least on a surface of the single crystal semiconductor layer;
    irradiating the single crystal semiconductor layer with ions mainly containing $H_3^+$ through the oxide film to form an embrittled layer in the single crystal semiconductor layer;
    bonding the single crystal semiconductor layer formed over the first single crystal semiconductor substrate and a second semiconductor substrate with the oxide film interposed therebetween;
    separating the single crystal semiconductor layer and the second semiconductor substrate from the first single crystal semiconductor substrate at the embrittled layer by a first heat treatment to obtain the first single crystal semiconductor substrate and the second semiconductor substrate to which the separated single crystal semiconductor layer is bonded;
    performing a planarization treatment on the single crystal semiconductor layer which is bonded to the second semiconductor substrate; and
    performing a second thermal oxidation treatment on the single crystal semiconductor layer after the step of performing the planarization treatment,
    wherein irradiating the single crystal semiconductor layer with ions to form an embrittled layer is performed only once during the method for manufacturing the SOI substrate.

2. The method for manufacturing an SOI substrate according to claim 1, wherein the embrittled layer is formed by exciting hydrogen gas to generate plasma containing $H_3^+$ ions and accelerating the ions contained in the plasma to the first single crystal semiconductor substrate.

3. The method for manufacturing an SOI substrate according to claim 1, wherein the second semiconductor substrate is any one of a single crystal silicon substrate, a polycrystalline silicon substrate, and a solar-grade silicon substrate.

4. The method for manufacturing an SOI substrate according to claim 1, wherein chemical mechanical polishing treatment is performed as the planarization treatment.

5. The method for manufacturing an SOI substrate according to claim 1, wherein a second heat treatment is performed after performing chemical mechanical polishing treatment as the planarization treatment.

6. The method for manufacturing an SOI substrate according to claim 1, further comprising the step of adding nitrogen in the first single crystal semiconductor substrate before forming the single crystal semiconductor layer.

7. The method for manufacturing an SOI substrate according to claim 1, wherein the first thermal oxidation treatment is performed at a temperature of 900° C. to 1150° C.

8. A method for manufacturing an SOI substrate comprising the steps of:
    forming a single crystal semiconductor layer over a first single crystal semiconductor substrate by an epitaxial growth method;
    performing a first thermal oxidation treatment on the first single crystal semiconductor substrate over which the single crystal semiconductor layer is formed to form an oxide film at least on a surface of the single crystal semiconductor layer in an atmosphere containing hydrochloric acid;
    irradiating the single crystal semiconductor layer with ions mainly containing $H_3^+$ through the oxide film to form an embrittled layer in the single crystal semiconductor layer;
    bonding the single crystal semiconductor layer formed over the first single crystal semiconductor substrate and a second semiconductor substrate with the oxide film interposed therebetween;
    separating the single crystal semiconductor layer and the second semiconductor substrate from the first single crystal semiconductor substrate at the embrittled layer by a first heat treatment to obtain the first single crystal semiconductor substrate and the second semiconductor substrate to which the separated single crystal semiconductor layer is bonded;
    performing a planarization treatment on the single crystal semiconductor layer which is bonded to the second semiconductor substrate;

performing a second thermal oxidation treatment on the single crystal semiconductor layer after the step of performing the planarization treatment, wherein irradiating the single crystal semiconductor layer with ions to form an embrittled layer is performed only once during the method for manufacturing the SOI substrate, and wherein the first thermal oxidation treatment is performed so that chlorine is contained in a region of the oxide film at a concentration ranging from $1 \times 10^{16}/cm^3$ to $5 \times 10^{21}/cm^3$.

9. The method for manufacturing an SOI substrate according to claim 8, wherein the embrittled layer is formed by exciting hydrogen gas to generate plasma containing $H_3^+$ ions and accelerating the ions contained in the plasma to the first single crystal semiconductor substrate.

10. The method for manufacturing an SOI substrate according to claim 8, wherein the second semiconductor substrate is any one of a single crystal silicon substrate, a polycrystalline silicon substrate, and a solar-grade silicon substrate.

11. The method for manufacturing an SOI substrate according to claim 8, wherein chemical mechanical polishing treatment is performed as the planarization treatment.

12. The method for manufacturing an SOI substrate according to claim 8, wherein a second heat treatment is performed after performing chemical mechanical polishing treatment as the planarization treatment.

13. The method for manufacturing an SOI substrate according to claim 8, further comprising the step of adding nitrogen in the first single crystal semiconductor substrate before forming the single crystal semiconductor layer.

14. The method for manufacturing an SOI substrate according to claim 8, wherein the first thermal oxidation treatment is performed at a temperature of 900° C. to 1150° C.

15. A method for manufacturing a semiconductor device comprising the steps of:

forming a single crystal semiconductor layer over a first single crystal semiconductor substrate by an epitaxial growth method;

performing a first thermal oxidation treatment on the first single crystal semiconductor substrate over which the single crystal semiconductor layer is formed to form an oxide film at least on a surface of the single crystal semiconductor layer;

irradiating the single crystal semiconductor layer with ions mainly containing $H_3^+$ through the oxide film to form an embrittled layer in the single crystal semiconductor layer;

bonding the single crystal semiconductor layer formed over the first single crystal semiconductor substrate and a second semiconductor substrate with the oxide film interposed therebetween;

separating the single crystal semiconductor layer and the second semiconductor substrate from the first single crystal semiconductor substrate at the embrittled layer by a first heat treatment to obtain the first single crystal semiconductor substrate and the second semiconductor substrate to which the separated single crystal semiconductor layer is bonded;

performing a planarization treatment on the single crystal semiconductor layer which is bonded to the second semiconductor substrate;

performing a second thermal oxidation treatment on the single crystal semiconductor layer after the step of performing the planarization treatment; and forming a gate electrode over the single crystal semiconductor layer with a gate insulating layer interposed therebetween, wherein irradiating the single crystal semiconductor layer with ions to form an embrittled layer is performed only once during the method for manufacturing the semiconductor device, wherein metal ions are introduced in the irradiating step, and wherein the oxide film is formed thicker than depths at which the metal ions are introduced in the irradiating step.

16. The method for manufacturing the semiconductor device according to claim 15, wherein the embrittled layer is formed by exciting hydrogen gas to generate plasma containing $H_3^+$ ions and accelerating the ions contained in the plasma to the first single crystal semiconductor substrate.

17. The method for manufacturing the semiconductor device according to claim 15, wherein the second semiconductor substrate is any one of a single crystal silicon substrate, a polycrystalline silicon substrate, and a solar-grade silicon substrate.

18. The method for manufacturing the semiconductor device according to claim 15, wherein chemical mechanical polishing treatment is performed as the planarization treatment.

19. The method for manufacturing the semiconductor device according to claim 15, wherein a second heat treatment is performed after performing chemical mechanical polishing treatment as the planarization treatment.

20. The method for manufacturing the semiconductor device according to claim 15, further comprising the step of adding nitrogen in the first single crystal semiconductor substrate before forming the single crystal semiconductor layer.

* * * * *